(12) United States Patent
Inoue et al.

(10) Patent No.: US 9,580,791 B2
(45) Date of Patent: Feb. 28, 2017

(54) VAPOR DEPOSITION MASK, AND MANUFACTURING METHOD AND MANUFACTURING DEVICE FOR ORGANIC EL ELEMENT USING VAPOR DEPOSITION MASK

(75) Inventors: Satoshi Inoue, Osaka (JP); Shinichi Kawato, Osaka (JP); Nobuhiro Hayashi, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 867 days.

(21) Appl. No.: 13/697,164

(22) PCT Filed: Apr. 26, 2011

(86) PCT No.: PCT/JP2011/060150
§ 371 (c)(1),
(2), (4) Date: Nov. 9, 2012

(87) PCT Pub. No.: WO2011/148750
PCT Pub. Date: Dec. 1, 2011

(65) Prior Publication Data
US 2013/0064969 A1 Mar. 14, 2013

(30) Foreign Application Priority Data

May 28, 2010 (JP) .................................. 2010-122926

(51) Int. Cl.
*C23C 16/04* (2006.01)
*H05B 33/10* (2006.01)
(Continued)

(52) U.S. Cl.
CPC .......... *C23C 14/042* (2013.01); *B05C 21/005* (2013.01); *H01L 51/0011* (2013.01); *H01L 51/50* (2013.01)

(58) Field of Classification Search
None
See application file for complete search history.

(56) References Cited

U.S. PATENT DOCUMENTS

| 5,742,129 A | 4/1998 | Nagayama et al. |
| 6,294,892 B1 | 9/2001 | Utsugi et al. |
| 2002/0059903 A1* | 5/2002 | Hasegawa ............. C23C 14/042 118/504 |

FOREIGN PATENT DOCUMENTS

| JP | 8-227276 A | 9/1996 |
| JP | 2000-188179 A | 7/2000 |

(Continued)

OTHER PUBLICATIONS

International Search Report received for PCT Patent Application No. PCT/JP2011/060150, mailed on Jun. 28, 2011, 5 pages, (2 pages of English translation and 3 pages of Search Report).

*Primary Examiner* — Dah-Wei D Yuan
*Assistant Examiner* — Jethro M Pence
(74) *Attorney, Agent, or Firm* — Morrison & Foerster LLP

(57) ABSTRACT

A vapor deposition mask (70) includes a first layer (71), a second layer (72) and a third layer (73) in this order. A plurality of first openings (71*h*), a plurality of second openings (72*h*) and a plurality of third openings (73*h*) are formed respectively in the first layer, the second layer and the third layer. The first openings, the second openings and the third openings communicate with each other, thereby constituting mask openings (75). The opening dimension of the second openings is larger than the opening dimension of the first openings and is larger than the opening dimension of the third openings. With this configuration, it is possible to prevent reduction of the opening dimension of the mask (Continued)

openings or clogging of the mask openings due to the vapor deposition particles adhering to the mask openings.

12 Claims, 23 Drawing Sheets

(51) Int. Cl.
  *C23C 14/04* (2006.01)
  *B05C 21/00* (2006.01)
  *H01L 51/00* (2006.01)
  *H01L 51/50* (2006.01)

(56) References Cited

FOREIGN PATENT DOCUMENTS

| | | | | |
|---|---|---|---|---|
| JP | 2001-237072 | A | 8/2001 | |
| JP | 2003-297562 | A | 10/2003 | |
| JP | 2004-39319 | A | 2/2004 | |
| JP | 2004-247058 | * | 9/2004 | ........... C23C 14/042 |
| JP | 2004-247058 | A | 9/2004 | |
| JP | 2004-349101 | * | 12/2004 | ........... C23C 14/042 |
| JP | 2004-349101 | A | 12/2004 | |
| JP | 2005-154879 | A | 6/2005 | |

\* cited by examiner

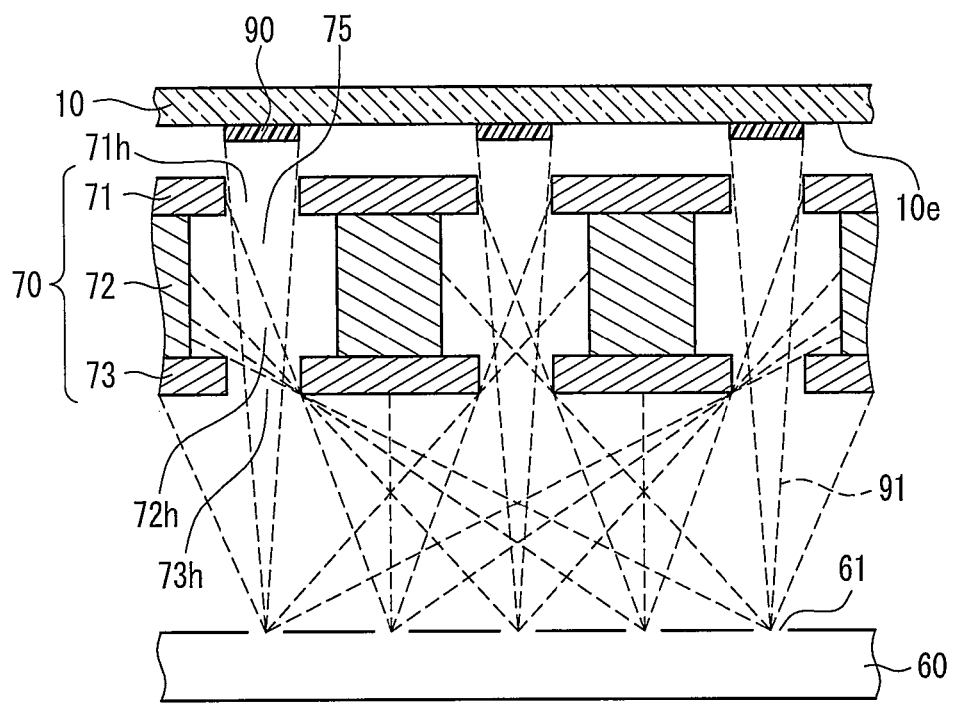
FIG. 10
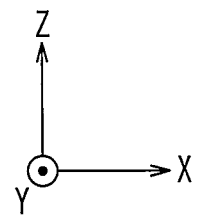

US 9,580,791 B2

VAPOR DEPOSITION MASK, AND MANUFACTURING METHOD AND MANUFACTURING DEVICE FOR ORGANIC EL ELEMENT USING VAPOR DEPOSITION MASK

CROSS REFERENCE TO RELATED APPLICATIONS

This is a U.S. National Phase patent application of PCT/JP2011/060150, filed Apr. 26, 2011, which claims priority to Japanese Patent Application No. 2010-122926, filed May 28, 2010, each of which is hereby incorporated by reference in the present disclosure in its entirety.

TECHNICAL FIELD

The present invention relates to a manufacturing method and a manufacturing device for an organic EL (Electro Luminescence) element that can be used in, for example, an organic EL display or the like. The present invention also relates to a vapor deposition mask that can be used suitably in manufacturing of an organic EL element.

BACKGROUND ART

In recent years, flat panel displays are required to have a large size, high image quality and low power consumption. Under the circumstances, high-image quality organic EL displays, which can be driven at a low voltage, are attracting great attention. Full-color active matrix type organic EL displays, for example, are provided with a thin film-like organic EL element on a substrate having a TFT (thin film transistor). In the organic EL element, organic EL layers including red (R), green (G) and blue (B) light emitting layers are laminated between a pair of electrodes. The TFT is connected to one of the pair of electrodes. Then, voltage is applied across the pair of electrodes so as to cause each light emitting layer to emit light, whereby an image is displayed.

In order to manufacture an organic EL element, it is necessary to form light emitting layers made of organic light emitting materials that emit respective colors in a predetermined pattern.

Known methods for forming light emitting layers in a predetermined pattern are vacuum vapor deposition method, inkjet method and laser transfer method. For example, the vacuum vapor deposition method is often used for low molecular organic EL displays (OLEDs).

In the vacuum vapor deposition method, a mask (also called a "shadow mask") having a predetermined pattern of opening s is used. The deposition surface of a substrate having the mask closely fixed thereto is disposed so as to oppose a vapor deposition source. Then, vapor deposition particles (film forming material) from the vapor deposition source are deposited onto the deposition surface through the opening s of the mask, whereby a predetermined pattern of thin films is formed. Vapor deposition is performed for each color of the light emitting layers, which is referred to as "vapor deposition by color".

For example, Patent Documents 1 and 2 disclose a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

PRIOR ART DOCUMENTS

Patent Document

Patent Document 1: JP H8-227276 A
Patent Document 2: JP 2000-188179 A

DISCLOSURE OF INVENTION

Problem to be Solved by the Invention

With conventional methods for performing vapor deposition by color as described above, as the substrate becomes larger, the mask needs to be large accordingly. However, when the mask is made large, a gap is likely to appear between the substrate and the mask by the mask being bent by its own weight or being extended. For this reason, it is difficult to perform highly accurate patterning, and it is therefore difficult to achieve high definition due to the occurrence of positional offset of vapor deposition and the occurrence of color mixing.

Also, when the mask is made large, the mask as well as a frame or the like for holding the mask needs to be big, which increases the weight and makes handling thereof difficult. As a result, there is a possibility that productivity and safety might be compromised. Also, the vapor deposition device and devices that are used together therewith need to be made big and complex as well, which makes device designing difficult and increases the installation cost.

For the reasons described above, the conventional methods for vapor deposition by color are difficult to adapt to large-sized substrates, and no methods have been devised that can perform vapor deposition by color on large-sized substrates such as those having a size exceeding 60 inches on a mass manufacturing level.

Also, in the case where vapor deposition is performed on a large-sized substrate, in order to cause vapor deposition particles to arrive uniformly on the deposition surface of the large-sized substrate, generally, the vapor deposition particles are discharged from a plurality of vapor deposition source openings. In this case, the vapor deposition particles coming from various directions enter mask openings. As a result, a problem arises in that the vapor deposition particles adhere to the inner circumferential surfaces of the openings, and the openings are gradually reduced in size and finally clogged. In order to prevent such clogging, it is necessary to frequently replace or clean the mask, which reduces the throughput for mass production.

It is an object of the present invention to provide a vapor deposition mask in which the possibility that the openings are reduced in size or clogged by adhesion of the vapor deposition particles is reduced. It is another object of the present invention to provide a manufacturing method and a manufacturing device for an organic FT, element, with which organic EL elements can be efficiently manufactured on large-sized substrates.

Means for Solving Problem

A vapor deposition mask according to the present invention is a vapor deposition mask for forming a coating film having a predetermined pattern on a substrate by causing vapor deposition particles to adhere to the substrate. A plurality of mask openings through which the vapor deposition particles pass are formed in the vapor deposition mask. The vapor deposition mask includes a first layer, a second layer and a third layer in this order. A plurality of first openings, a plurality of second openings and a plurality of third openings are formed respectively in the first layer, the second layer and the third layer. The first openings, the second openings and the third openings communicate with each other, thereby constituting the mask openings. And, an opening dimension of the second openings is larger than an opening dimension of the first openings and is larger than an opening dimension of the third openings.

A method for manufacturing an organic EL element according to the present invention is a manufacturing method for an organic EL element including a coating film having a predetermined pattern on a substrate, the method including a vapor deposition step of forming the coating film by causing vapor deposition particles to adhere to the substrate. The vapor deposition step is a step in which with the use of a vapor deposition unit including a vapor deposition source having a vapor deposition source opening that discharges the vapor deposition particles and a vapor deposition mask disposed between the vapor deposition source opening and the substrate, in a state in which the substrate and the vapor deposition mask are spaced apart at a fixed interval, the vapor deposition particles that have passed through a plurality of mask openings formed in the vapor deposition mask are caused to adhere to the substrate while one of the substrate and the vapor deposition unit is moved relative to the other. And, the vapor deposition mask of the present invention is used as the vapor deposition mask.

A device for manufacturing an organic EL element according to the present invention is a manufacturing device for an organic EL element including a coating film having a predetermined pattern on a substrate, the device including: a vapor deposition unit including a vapor deposition source having a vapor deposition source opening that discharges vapor deposition particles for forming the coating film and a vapor deposition mask disposed between the vapor deposition source opening and the substrate; and a moving mechanism that moves one of the substrate and the vapor deposition unit relative to the other in a state in which the substrate and the vapor deposition mask are spaced apart by a fixed interval. And, the vapor deposition mask of the present invention is used as the vapor deposition mask.

Effects of the Invention

In the vapor deposition mask of the present invention, the first openings of the first layer, the second openings of the second layer and the third openings of the third layer communicate with each other, thereby constituting the mask openings, and the second openings have an opening dimension larger than the first openings and the third openings. Accordingly, even if the vapor deposition particles adhere to the inner circumferential surface of the second openings, the effective opening dimension of the mask openings varies little, and the occurrence of clogging can be prevented.

When the vapor deposition mask is made thick by increasing the thickness of the second layer that constitutes the vapor deposition mask, the departure angle of the vapor deposition particles passing through the mask openings can be limited. By applying this vapor deposition mask to a new vapor deposition method (details of which will be described later) in which vapor deposition is performed via a vapor deposition mask while one of a substrate and a vapor deposition unit is moved relative to the other, it is possible to efficiently perform vapor deposition by color on a large-sized substrate.

The manufacturing method and the manufacturing device for an organic EL element of the present invention use the new vapor deposition method mentioned above, and therefore a vapor deposition mask smaller than the substrate can be used. Accordingly, vapor deposition by color can be performed on a large-sized substrate.

Furthermore, the manufacturing method and the manufacturing device for an organic EL element of the present invention use, as a vapor deposition mask, the above-described vapor deposition mask of the present invention, and therefore the possibility that the opening dimension of the mask openings is reduced or the mask openings are clogged can be reduced, and thus organic EL elements can be efficiently manufactured.

BRIEF DESCRIPTION OF DRAWINGS

FIG. 10 is an enlarged cross-sectional view of the organic EL element manufacturing device according to Embodiment 1 of the present invention taken along the line X-X shown in FIG. 9.

DESCRIPTION OF THE INVENTION

Figure 1:
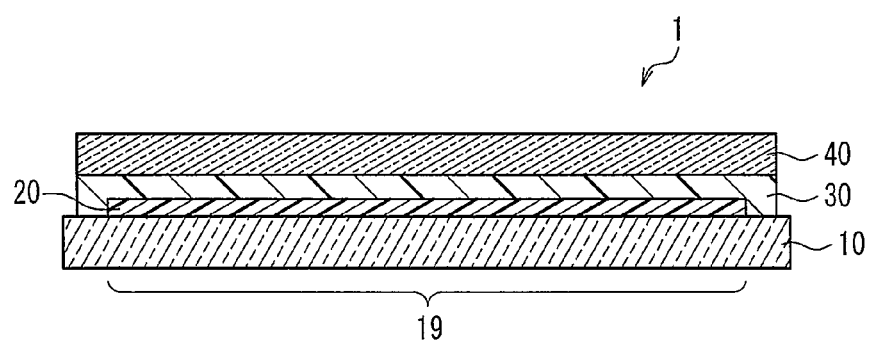
FIG. 1 is a cross-sectional view showing a schematic configuration of an organic EL display.

In the above-described vapor deposition mask of the present invention, it is preferable that the second layer is thicker than the first layer and the third layer. It is thereby possible to increase the thickness of the vapor deposition mask while the precision of the mask opening pattern of the vapor deposition mask is secured. The upper limit of the departure angle of the vapor deposition particles departing from the mask openings of the vapor deposition mask can be lowered by increasing the thickness of the vapor deposition mask, and therefore even when the vapor deposition mask and the substrate are spaced apart from each other, it is possible to suppress the occurrence of a blur at the edges of the coating film.

The opening dimension of the first openings may be the same as the opening dimension of the third openings. With this configuration, the occurrence of a blur at the edges of the coating film can be further suppressed.

Alternatively, the opening dimension of the first openings may be different from the opening dimension of the third openings. With this configuration, the vapor deposition mask can be made easily in a small number of steps.

It is preferable that the first layer and the third layer are made of the same material. With this configuration, it is possible to suppress a situation in which the vapor deposition mask is warped by heat during vapor deposition.

It is preferable that the vapor deposition mask has a thickness of 1.2 mm or greater. By forming the vapor deposition mask so as to have the above thickness, the occurrence of a blur at the edges of the coating film can be further suppressed.

It is preferable that the first layer and the third layer both have a thickness of 0.1 mm or less. By reducing the thicknesses of the first layer and the third layer, first openings and third openings that have a very small opening dimension can be formed in the first layer and the third layer with high precision. Also, it is possible to suppress a situation in which the vapor deposition particles adhere to the inner circumferential surfaces of the first opening and the third opening, as a result of which reduction of the opening dimension of the mask openings or clogging of the mask openings due to adhesion of the vapor deposition particles can be suppressed.

It is preferable that the coating film is a light emitting layer constituting an organic EL element. With this configuration, it is possible to manufacture an organic EL element with little nonuniform light emission at a high aperture ratio.

Hereinafter, the present invention will be described in detail by showing preferred embodiments. It should be noted, however, that the present invention is not limited to the following embodiments. For the sake of convenience of the description, the drawings referred to hereinafter show only the principal members required to describe the present invention in simplified form among the constituent members of the embodiments of the present invention. Accordingly, the present invention may include arbitrary constituent members that are not shown in the following drawings. Also, the dimensions of the members in the drawings do not faithfully represent the actual dimensions or dimensional proportions of the constituent members.

(Configuration of Organic EL Display)

An example of an organic EL display that can be manufactured by applying the present invention will be described. This organic EL display is a bottom emission type organic EL display in which light is extracted from the TFT substrate side and that displays full color images by controlling light emission of red (R), green (G) and blue (B) pixels (sub-pixels).

First, the overall configuration of the organic EL display will be described below.

Figure 2:
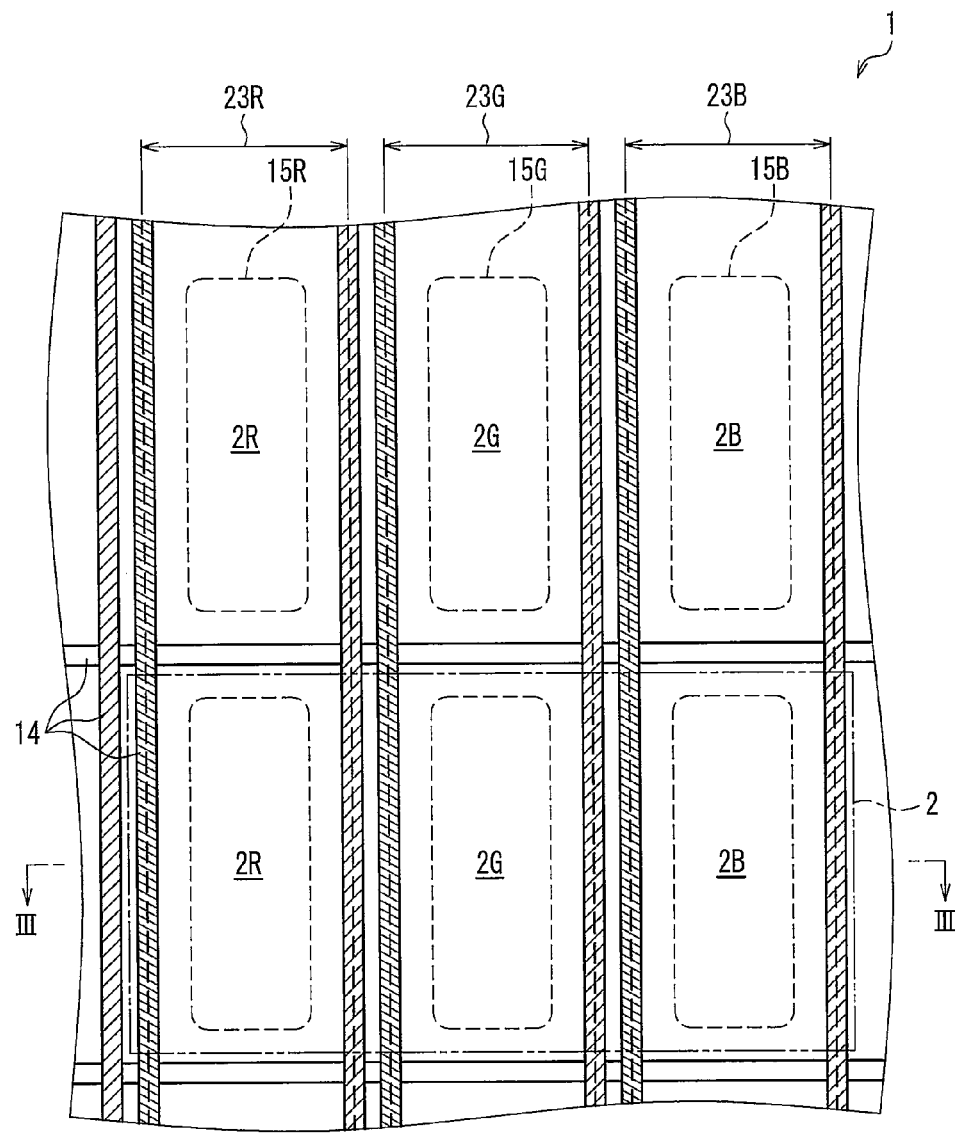
FIG. 2 is a plan view showing a configuration of pixels that constitute the organic EL display shown in FIG. 1.
Figure 3:
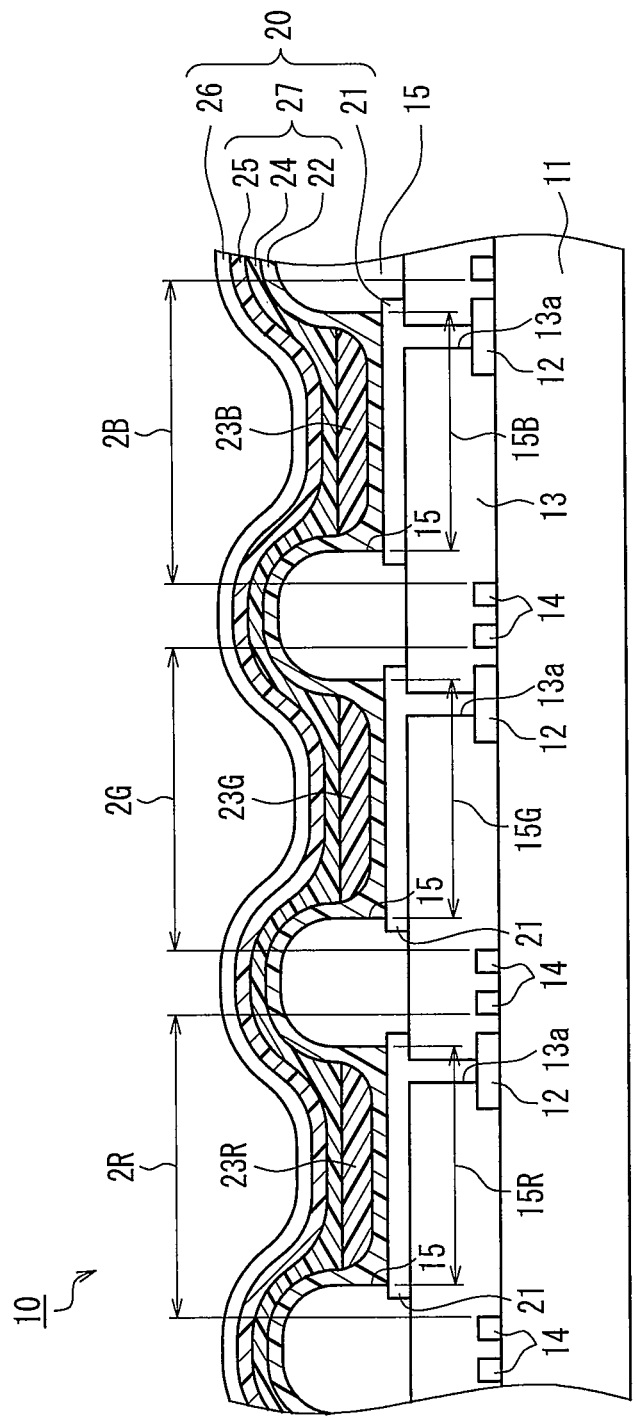
FIG. 3 is a cross-sectional view of a TFT substrate that constitutes the organic EL display taken along the line III-III of FIG. 2.

FIG. 1 is a cross-sectional view showing a schematic configuration of the organic EL display. FIG. 2 is a plan view showing a configuration of pixels that constitute the organic EL display shown in FIG. 1. FIG. 3 is a cross-sectional view of a TFT substrate that constitutes the organic EL display, taken along the line III-III of FIG. 2.

As shown in FIG. 1, the organic EL display 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the perpendicular direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described. As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the light emitting layers 23R, 23G and 23B. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the light emitting layers 23R, 23G and 23B.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

The organic EL element 20 can take, for example, the following layer configurations as shown in (1) to (8) below.
(1) First electrode/light emitting layer/second electrode
(2) First electrode/hole transport layer/light emitting layer/electron transport layer/second electrode
(3) First electrode/hole transport layer/light emitting layer/hole blocking layer/electron transport layer/second electrode
(4) First electrode/hole transport layer/light emitting layer/hole blocking layer/electron transport layer/electron injection layer/second electrode
(5) First electrode/hole injection layer/hole transport layer/light emitting layer/electron transport layer/electron injection layer/second electrode
(6) First electrode/hole injection layer/hole transport layer/light emitting layer/hole blocking layer/electron transport layer/second electrode
(7) First electrode/hole injection layer/hole transport layer/light emitting layer/hole blocking layer/electron transport layer/electron injection layer/second electrode
(8) First electrode/hole injection layer/hole transport layer/electron blocking layer (carrier blocking layer)/light emitting layer/hole blocking layer/electron transport layer/electron injection layer/second electrode In the layer configurations listed above, for example, the hole injection layer and the hole transport layer may be integrated into a single layer. Likewise, the electron transport layer and the electron injection layer may be integrated into a single layer.

The configuration of the organic EL element 20 is not limited to the layer configurations (1) to (8) listed above, and it is possible to use, for example, any desired layer configuration according to the characteristics required of the organic EL element 20.

(Manufacturing Method for Organic EL Display)

A method for manufacturing an organic EL display 1 will be described below.

Figure 4:
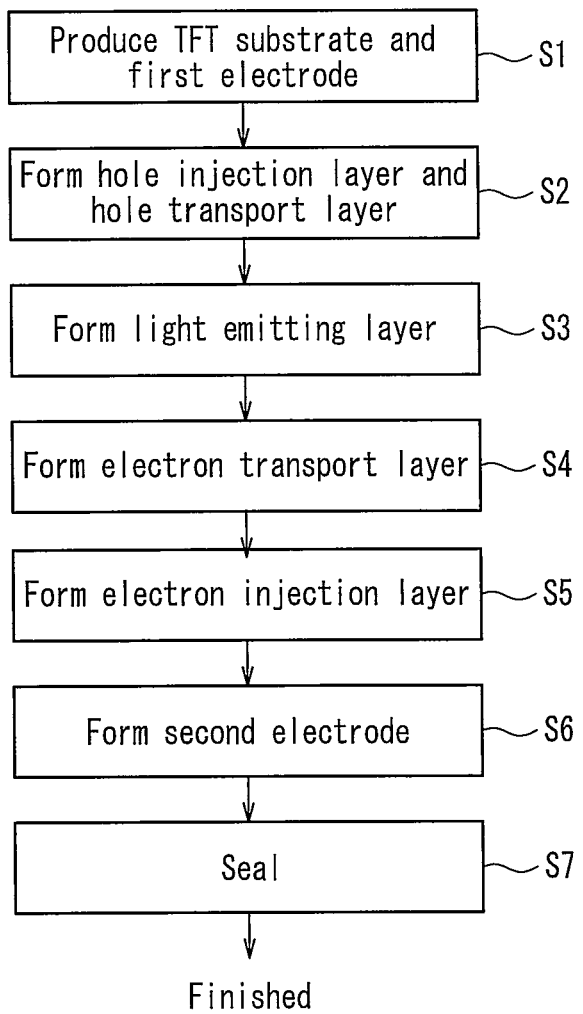
FIG. 4 is a flowchart illustrating the steps of a process for manufacturing an organic EL display in order.

FIG. 4 is a flowchart illustrating the steps of a process for manufacturing the above-described organic EL display 1 in order.

As shown in FIG. 4, the method for manufacturing an organic EL display 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto.

Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. The insulating substrate 11 can have, although not limited to, a thickness of, for example, 0.7 to 1.1 mm and longitudinal and transverse dimensions of, for example, 500 mm×400 mm. As an example, a rectangular glass plate having a thickness of about 1 mm and longitudinal and transverse dimensions of 500×400 mm can be used.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Examples of acrylic resin include OPTMER series available from JSR Corporation. Examples of polyimide resin include Photoneece series available from Toray Industries, Inc. Generally, polyimide resin is not transparent but colored. For this reason, when manufacturing a bottom emission type organic EL display 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, as a conductive film (electrode film), for example, an ITO (indium tin oxide) film is formed so as to have a thickness of, for example, 100 nm, on the inter-layer film 13 by a sputtering method or the like. Next, a photoresist is applied onto the ITO film and patterning is performed by using a photolithography technique, after which the ITO film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials, other than ITO, that can be used for the first electrode 21 include transparent conductive materials such as IZO (indium zinc oxide) and gallium-added zinc oxide (GZO); and metal materials such as gold (Au), nickel (Ni) and platinum (Pt).

As the method for laminating conductive films, other than a sputtering method, it is possible to use a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the inter-layer film 13. As an example, an edge cover 15 having a thickness of about 1 µm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof polysilane-based compounds; vinylcarbazole-based compounds; heterocyclic conjugated monomers, oligomers or polymers such as thiophene-based compounds, aniline-based compounds; and the like.

As an example, a hole injection and transport layer 22 having a thickness of 30 nm can be formed using 4,4'-bis [N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex; bis(benzoquinolinato) beryllium complex; tri(dibenzoylmethyl)phenanthroline europium complex; ditolyl vinyl biphenyl; and the like.

The light emitting layers 23R, 23G and 23B can have a thickness of, for example, 10 to 100 nm.

The vapor deposition mask and manufacturing method and manufacturing device for an organic EL element using the vapor deposition mask according to the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof; LiF (lithium fluoride); and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxy-quinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic FT, display 1 is obtained.

In the organic EL display 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, S3, which is the step of forming light emitting layers 23R, 23G and 23B by vapor deposition by color, will be described.

(New Vapor Deposition Method)

The present inventors investigated, as the method for forming light emitting layers 23R, 23G and 23B by vapor deposition by color, a new vapor deposition method (hereinafter referred to as the "new vapor deposition method") in which vapor deposition is performed while a substrate is moved with respect to a vapor deposition source and a vapor deposition mask, instead of the vapor deposition method as disclosed in Patent Documents 1 and 2 in which a mask having the same size as a substrate is fixed to the substrate at the time of vapor deposition.

Figure 5:
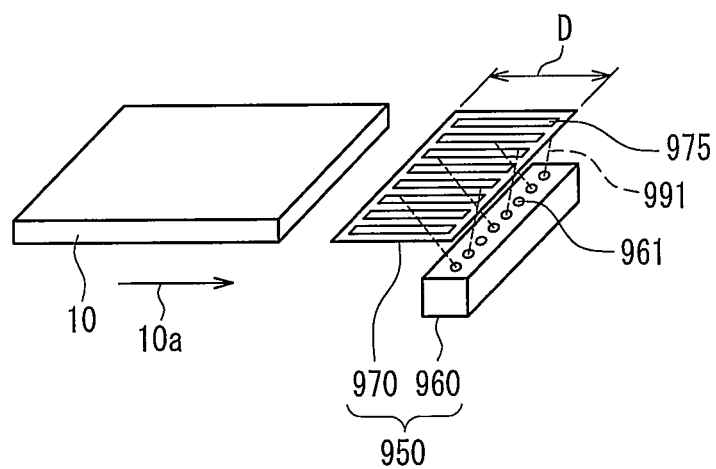
FIG. 5 is a perspective view showing the basic concept of a new vapor deposition method.

FIG. 5 is a perspective view showing the basic concept of the new vapor deposition method.

A vapor deposition source 960 and a vapor deposition mask 970 together constitute a vapor deposition unit 950. The relative position between the vapor deposition source 960 and the vapor deposition mask 970 is constant. A substrate 10 is moved at a constant speed in a direction indicated by 10a on the opposite side across the vapor deposition mask 970 from the vapor deposition source 960. A plurality of vapor deposition source openings 961 through which vapor deposition particles 991 are discharged are formed on the upper surface of the vapor deposition source 960. A plurality of mask openings 975 are formed in the vapor deposition mask 970. The vapor deposition particles 991 discharged from the vapor deposition source openings 961 pass through the mask openings 975 and adhere to the substrate 10. Vapor deposition is repeatedly performed for each color of light emitting layers 23R, 23G and 23B, whereby vapor deposition by color for forming light emitting layers 23R, 23G and 23B can be performed.

According to this new vapor deposition method, a dimension D of the vapor deposition mask 970 in the movement direction 10a of the substrate 10 can be set irrespective of a dimension of the substrate 10 in the same direction. This enables the use of a vapor deposition mask 970 that is smaller than the substrate 10. Accordingly, even if the substrate 10 is made large, the vapor deposition mask 970 does not need to be made large, and therefore the problem in that the vapor deposition mask 970 is bent by its own weight or being extended does not occur. Also, the vapor deposition mask 970 and a frame or the like for holding the vapor deposition mask 970 do not need to be made big and heavy. Accordingly, the problems encountered with the conventional vapor deposition methods disclosed in Patent Documents 1 and 2 are solved, and large-sized substrates can be subjected to vapor deposition by color.

However, the present inventors found, as a result of a further investigation, the new vapor deposition method shown in FIG. 5 is problematic in that a blur is more likely to occur at the edges of the formed coating film (vapor deposition film) as compared to the vapor deposition methods of Patent Documents 1 and 2. The cause of this problem will be described below.

Figure 6:
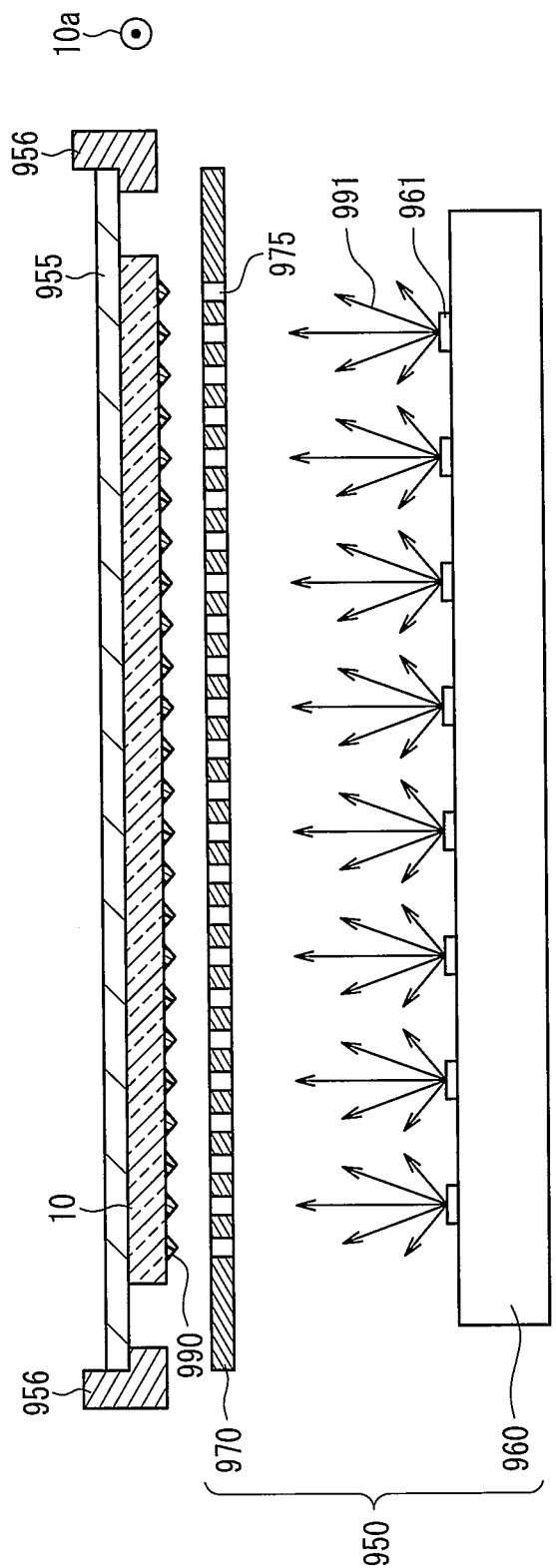
FIG. 6 is a cross-sectional view of the vapor deposition device shown in FIG. 5 as viewed in a plane perpendicular to the movement direction of a substrate.

FIG. 6 is a cross-sectional view of the vapor deposition device shown in FIG. 5 as viewed in a plane perpendicular to the movement direction 10a of the substrate 10. In FIG. 6, reference numeral 955 denotes a holding device for holding the substrate 10, 956 denotes a moving mechanism that moves the substrate 10 held by the holding device 955 in the direction indicated by the arrow 10a. A plurality of vapor deposition source openings 961 and a plurality of the mask opening 975 are arranged in the right-left direction of FIG. 6. The vapor deposition particles 991 from each vapor deposition source opening 961 are discharged over a certain range (directivity). Specifically, in FIG. 6, the number of vapor deposition particles 991 discharged from each vapor deposition source opening 961 is the greatest in a direction directly above the vapor deposition source opening 961 and gradually decreases as the angle (departure angle) formed with respect to the straight upward direction increases. The vapor deposition particles 991 discharged from the vapor deposition source openings 961 travel straight in their discharged direction. In FIG. 6, the flow of vapor deposition particles 991 discharged from the vapor deposition source openings 961 is conceptually indicated by arrows. Accordingly, each mask opening 975 mostly receives, but not necessarily limited thereto, the vapor deposition particles 991 discharged from the vapor deposition source opening 961 located directly below the mask opening 975 and also receives the vapor deposition particles 991 discharged from the vapor deposition source openings 961 located obliquely downward.

Figure 7:
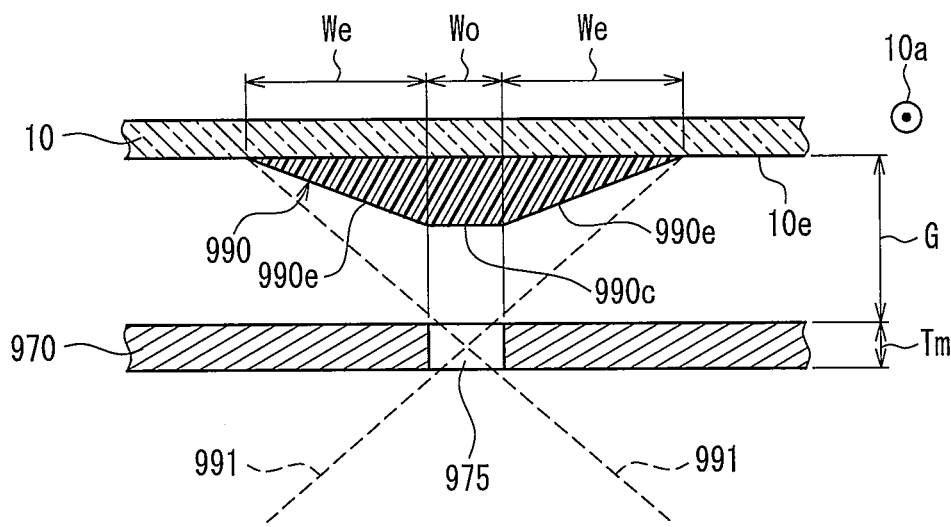
FIG. 7 is a cross-sectional view illustrating the cause of a blur generated at the edges of a coating film in the new vapor deposition method shown in FIG. 5.

FIG. 7 is a cross-sectional view of a coating film 990 formed on a substrate 10 by vapor deposition particles 991 that have passed through a mask opening 975, as viewed in a plane perpendicular to the movement direction 10a of the substrate 10 as in FIG. 6. As described above, the vapor deposition particles 991 coming from various directions pass through the mask opening 975. The number of vapor deposition particles 991 that reach a deposition surface 10e of the substrate 10 is the greatest in a region directly above the mask opening 975 and gradually decreases as the position gets farther away therefrom. Accordingly, as shown in FIG. 7, on the deposition surface 10e of the substrate 10, a constant thickness portion 990c whose thickness is constant and the thickest is formed in a region directly above the mask opening 975, and a thickness tapered portion 990e that becomes gradually thinner as the position gets farther away from the constant thickness portion 990c is formed on both sides of the constant thickness portion 990c. The thickness tapered portion 990e causes a blur at the edge of the coating film 990.

If such a thickness tapered portion 990e is formed in the openings 15R, 15G and 15B for the sub-pixels 2R, 2G and 2B, it may cause nonuniform light emission or reduce the service life of the element. If the opening width is reduced in order to prevent the problem, the aperture ratio will decrease and the brightness will be reduced.

Accordingly, it is necessary to reduce a width We of the thickness tapered portion 990e. The following methods may be used to this end.

The first method is to reduce an interval G between the vapor deposition mask 970 and the substrate 10. However, with the new vapor deposition method, the substrate 10 needs to be moved relative to the vapor deposition mask 970, and therefore it is not possible to set the interval G between the vapor deposition mask 970 and the substrate 10 to zero.

The second method is to increase the thickness of the vapor deposition mask 970. As shown in FIG. 7, if the thickness of the vapor deposition mask 970 is represented by Tm, and the width of the mask opening 975 is represented by Wo (which corresponds to the width of the constant thickness portion 990c), the width We of the thickness tapered portion 990e can be determined by the following equation:

$$We = G \cdot Wo/Tm \quad (1).$$

Accordingly, if the thickness Tm of the vapor deposition mask 970 is increased, the width We of the thickness tapered portion 990e is reduced.

If the proportion of the width We of the thickness tapered portion 990e on one side of the constant thickness portion 990c to the width Wo of the constant thickness portion 990c is defined as an allowable blur rate B (%), the allowable blur rate B can be determined by the following equation:

$$B = (We/Wo) \times 100 \quad (2).$$

From the above equations (1) and (2), the thickness Tm of the vapor deposition mask 970 can be determined by the following equation:

$$Tm = 100G/B \quad (3).$$

For example, organic EL displays are required to have an aperture ratio for pixels of 25% or greater. In order to achieve an aperture ratio of 25% or greater without causing "color mixing" in which to a light emitting layer, the material of a neighboring light emitting layer having a different color enters, it is desirable that the allowable blur rate B is 25% or less.

In order to move one of the vapor deposition mask 970 and the substrate 10 relative to the other without causing the vapor deposition mask 970 and the substrate 10 to collide with each other, it is preferable that the interval G between the vapor deposition mask 970 and the substrate 10 is 0.3 mm or greater, and 3 mm is approximately sufficient for the interval G.

Accordingly, from the above equation (3), the thickness Tm of the vapor deposition mask 970 is desirably 1.2 mm or greater, and particularly desirably 12 mm or greater. Currently, the vapor deposition masks generally used to manufacture organic EL elements have a thickness of 100 μm or less, and so it can be said that the above-described vapor deposition mask having a thickness well over 1 mm is very thick.

A situation is conceivable in which the width Wo of the mask opening 975 is set to, for example, approximately 100 μm. Generally speaking, forming such fine mask openings 975 in the vapor deposition mask 970 having a thickness of approximately several millimeters, which is 10 times or more thicker than that of the opening width Wo, is extremely difficult and therefore not suitable for mass production, and also it requires high cost.

Even if mask openings 975 can be formed at such a high aspect ratio (=thickness Tm/opening width Wo), another problem arises in that the mask openings 975 are likely to be clogged by the vapor deposition material. This will be described with reference to FIGS. 8A to 8C.

Figure 8A:
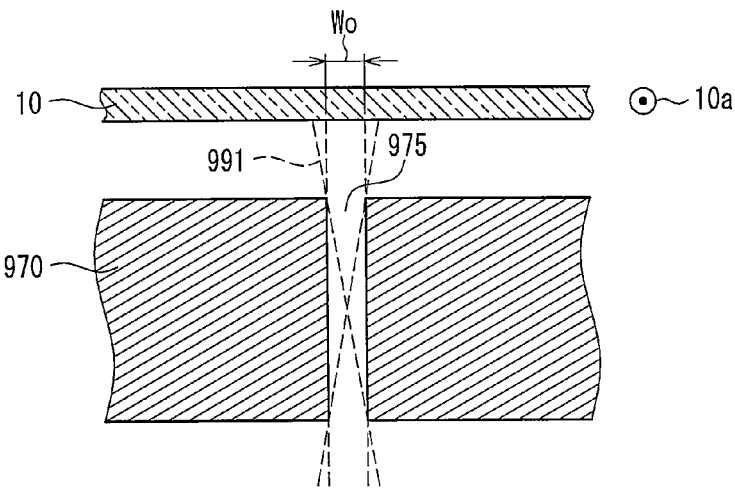
FIGS. 8A to 8C are enlarged cross-sectional views illustrating how a mask opening formed at a high aspect ratio is clogged by a vapor deposition material.
Figure 8B:
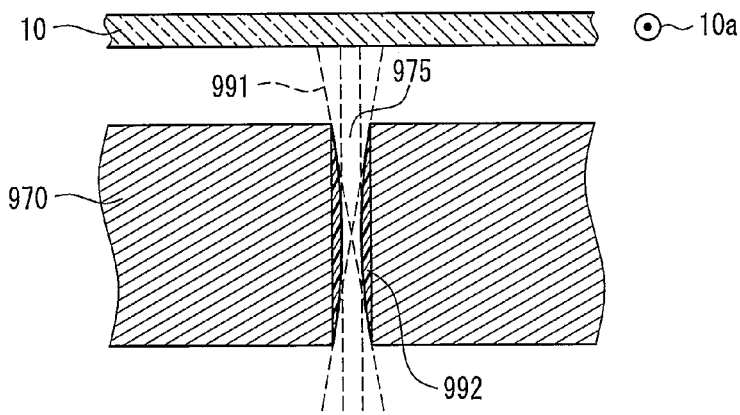
Figure 8C:
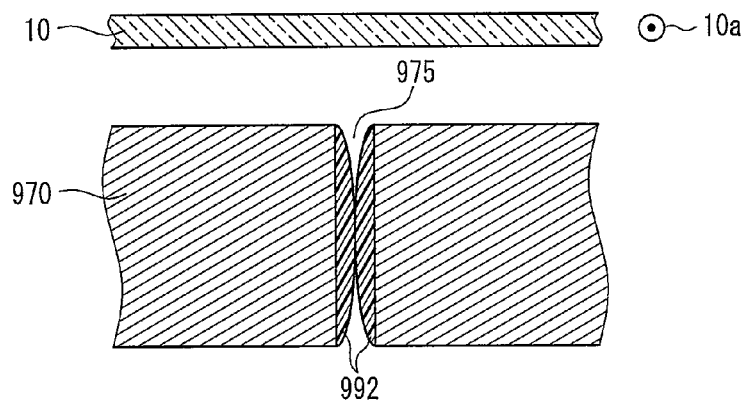

FIG. 8A is a cross-sectional view showing a state immediately after the start of forming a coating film on the substrate 10 by using a vapor deposition mask 970 in which mask openings 975 are formed at a high aspect ratio. When a certain length of time has elapsed after the start of vapor deposition, as shown in FIG. 8B, the vapor deposition particles 991 adhere to the inner circumferential surface of a mask opening 975, and a vapor deposition material layer 992 is thereby formed. The vapor deposition material layer 992 narrows the effective width (the width of the mask opening 975 through which the vapor deposition particles 991 can pass) of the mask opening 975. In the case where, for example, the width Wo of the mask opening 975 is approximately 100 μm, if the thickness of the vapor deposition material layer 992 reaches approximately 5 μm, it may cause harmful effects on the width and thickness of the coating film formed on the substrate 10. When another certain length of time has elapsed, the vapor deposition material layer 992 becomes thicker. In the case where, for example, the width Wo of the mask opening 975 is approximately 100 μm, if the thickness of the vapor deposition material layer 992 reaches approximately 50 μm, as shown in FIG. 8C, the vapor deposition material layer 992 blocks the mask openings 975, which causes clogging.

If the aspect ratio of the mask opening 975 is increased, the number of vapor deposition particles 991 that collide with the inner wall surface of the mask openings 975 increases, and thus the vapor deposition material layer 992 is easily formed. Furthermore, because the width of the mask openings 975 is small, clogging occurs in a short time by the vapor deposition material layer 992 being slightly formed.

The present inventors conducted an in-depth investigation to solve the problems described above and found a configuration for vapor deposition masks having mask openings that are provided at a high aspect ratio but unlikely to be clogged. They also found that application of this vapor deposition mask to the new vapor deposition method (see FIG. 5) reduces the width We of the tapered portion of the coating film even when the vapor deposition mask and the substrate are spaced apart from each other, and thus the problem encountered with the new vapor deposition method, namely, the occurrence of blur at the edges of the coating film, can be solved. This finding has made it possible to form the organic EL element on a large-sized substrate at a high aperture ratio and provide a large-sized organic EL display having high brightness.

Hereinafter, preferred embodiments of the present invention will be described.

Embodiment 1

Manufacturing Method and Device for Organic EL Element

Figure 9:
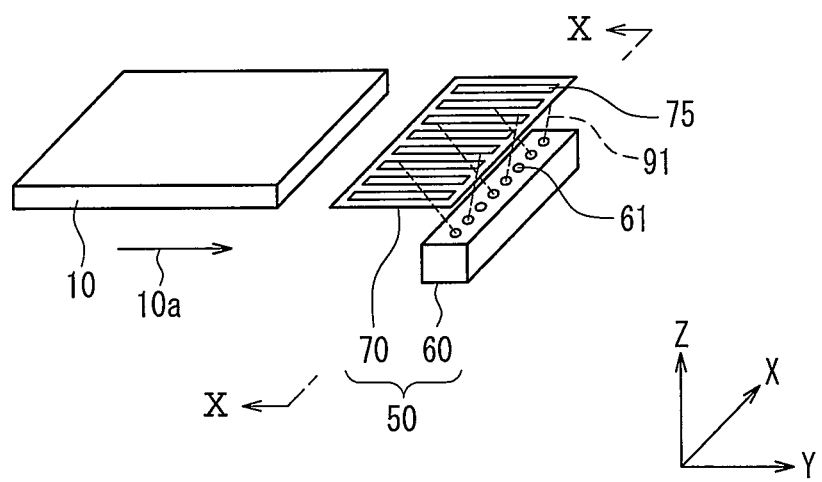
FIG. 9 is a perspective view showing a schematic configuration of a manufacturing device for an organic EL element according to Embodiment 1 of the present invention.

FIG. 9 is a perspective view showing a schematic configuration of an organic EL element manufacturing device according to Embodiment 1 of the present invention. For the sake of convenience of the description given below, an XYZ orthogonal coordinate system is set in which a horizontal axis extending along the width direction of the substrate 10 is defined as the X axis, a horizontal axis perpendicular to the X axis is defined as the Y axis, and an up-down direction axis parallel to the X axis and the Y axis is defined as the Z axis. An XY plane is parallel to the deposition surface 10e of the substrate 10 (see FIG. 10, which will be descried later).

A vapor deposition mask 70 is disposed so as to oppose a vapor deposition source 60 in the Z axis direction. The relative position between the vapor deposition source 60 and the vapor deposition mask 70 is constant. The vapor deposition source 60 and the vapor deposition mask 70 together constitute a vapor deposition unit 50.

The substrate 10 is held by a holding device (not shown). As the holding device, for example, as with the holding device 955 shown in FIG. 6, an electrostatic chuck that holds the surface of the substrate 10 opposite to the deposition surface 10e of the substrate 10 with electrostatic force can be used. The substrate 10 can thereby be held substantially without the substrate 10 being bent by its own weight. However, the holding device for holding the substrate 10 is not limited to an electrostatic chuck and may be any other device.

The substrate 10 held by the holding device is moved (scanned) in a direction 10a at a constant speed by an unshown moving mechanism (see the moving mechanism 956 shown in FIG. 6) on the opposite side across the vapor deposition mask 70 from the vapor deposition source 60 in a state in which the substrate 10 is spaced apart from the vapor deposition mask 70 at a fixed interval. In Embodiment 1, the movement direction of the substrate 10 matches the positive direction of the Y axis. The movement of the substrate 10 may be a reciprocal movement or a single direction movement in which the substrate 10 is moved in either direction. There is no particular limitation on the configuration of the moving mechanism. For example, any known transfer driving mechanism can be used such as a linear motor or a feed screw mechanism that rotates a feed screw by a motor.

The vapor deposition unit 50, the substrate 10, the holding device for holding the substrate 10 and the moving mechanism for moving the substrate 10 are housed in a vacuum chamber (not shown). The vacuum chamber is a hermetically sealed container, with its internal space being vacuumed to a predetermined low pressure state and maintained.

The vapor deposition source 60 includes, in its upper surface (specifically, the surface that opposes the vapor deposition mask 70), a plurality of vapor deposition source openings 61. The plurality of vapor deposition source openings 61 are arranged at an equal interval along the X axis. Each vapor deposition source opening 61 is upwardly open along the Z axis and discharges vapor deposition particles 91, which are a light emitting layer-forming material, toward the vapor deposition mask 70. In the present invention, it is sufficient that the vapor deposition source opening is configured to discharge vapor deposition particles 91 toward the vapor deposition mask 70, and thus the shape, number, arrangement and the like of the vapor deposition source opening are not limited to FIG. 9. For example, the vapor deposition source opening may be provided as a single slit-shaped opening extending in the X axis direction. Alternatively, a plurality of slit-shaped openings extending in the X axis direction may be formed at different positions in the Y axis direction. Alternatively, columns in which vapor deposition source openings are formed so as to be linearly aligned in parallel with the X axis may be arranged at different positions.

Figure 12A:
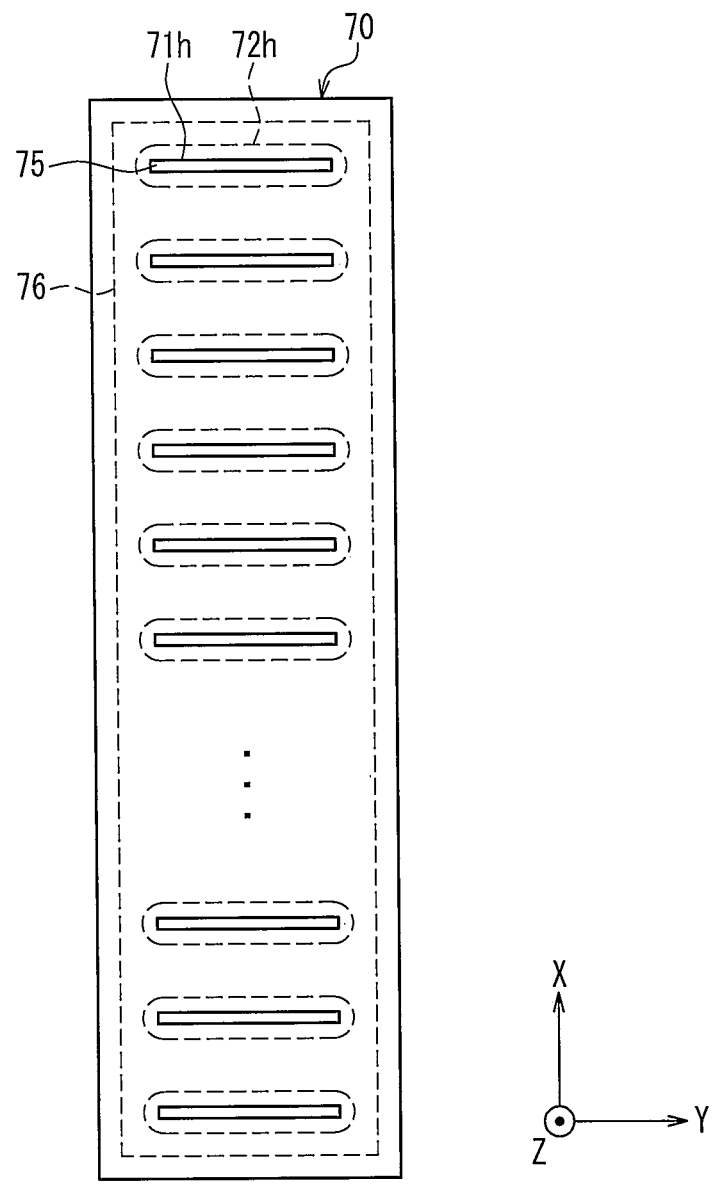
FIG. 12A is a plan view showing an example of a mask opening pattern of the vapor deposition mask according to Embodiment 1 of the present invention.

FIG. 12A is a plan view of a vapor deposition mask 70. In the vapor deposition mask 70, a plurality of mask openings 75 are formed at different positions in the X axis direction. The plurality of mask openings 75 are arranged along the X axis direction. Each mask opening 75 is a slit-shaped opening extending in the Y axis direction.

FIG. 10 is a cross-sectional view of the organic EL element manufacturing device according to the present embodiment, taken along a plane parallel to the XZ plane including the line X-X passing through the plurality of vapor deposition source openings 61 shown in FIG. 9.

The vapor deposition mask 70 includes, from the substrate 10 side toward the vapor deposition source 60 side, a first layer 71, a second layer 72 and a third layer 73 in this order. The first layer 71 includes a plurality of first openings 71h formed therein, the second layer 72 includes a plurality of second openings 72h formed therein, and the third layer 73 includes a plurality of third openings 73h formed therein. By a first opening 71h, a second opening 72h and a third opening 73h communicating with each other, a mask opening 75 in the vapor deposition mask 70 is formed. The opening dimension of the second opening 72h is larger than the opening dimension of the first opening 71h and is larger than the opening dimension of the third opening 73h.

By using the manufacturing device for an organic EL element of the present embodiment configured as described above, light emitting layers 23R, 23G and 23B (see FIG. 3) are formed as follows.

The substrate 10 is moved in the Y axis direction while vapor deposition particles 91 are discharged from a plurality of vapor deposition source openings 61 of the vapor deposition source 60. The vapor deposition particles 91 discharged from the vapor deposition source openings 61 pass through a plurality of mask openings 75 formed in the vapor deposition mask 70 and arrive at a deposition surface (or in other words, the surface of the substrate 10 facing the vapor deposition mask 70) 10e of the substrate 10. As a result, the vapor deposition particles 91 adhere to the deposition surface 10e of the substrate 10, and a plurality of stripe-shaped coating films 90 parallel to the Y axis direction are thereby formed.

By performing vapor deposition three times by changing the vapor deposition material 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

In the above embodiment, the substrate 10 is moved relative to the vapor deposition unit 50 that does not move, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In the above embodiment, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

<Vapor Deposition Mask>

A function of the vapor deposition mask 70 of the present embodiment will be described.

In the present embodiment as well, as in the new vapor deposition method shown in FIGS. 5 and 6, the vapor deposition particles 91 are discharged over a certain range (directivity) from the vapor deposition source openings 61. Since the space including the vapor deposition unit 50 is maintained at a predetermined degree of vacuum, the individual vapor deposition particles 91 travel almost straight in their discharge direction. Accordingly, as shown in FIG. 10, each mask opening 75 of the vapor deposition mask 70 receives, in addition to the vapor deposition particles 91 discharged from the vapor deposition source opening 61 located directly below the mask opening 75, the vapor deposition particles 91 discharged from the vapor deposition source openings 61 located obliquely downward. In other words, the vapor deposition particles 91 coming from various incidence angles enter the mask opening 75. As used herein, "incidence angle" of the vapor deposition particles 91 is defined as the angle formed between the traveling direction of the vapor deposition particles 91 entering a mask opening 75 and the Z axis on a projection onto the XZ plane.

Figure 11A:
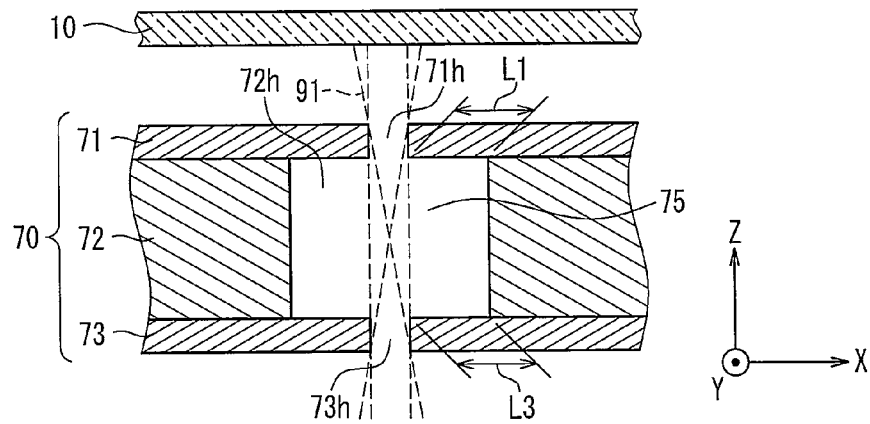
FIGS. 11A to 11C are enlarged cross-sectional views illustrating how vapor deposition material adheres to the inner circumferential surface of a mask opening of the vapor deposition mask according to Embodiment 1 of the present invention.
Figure 11B:
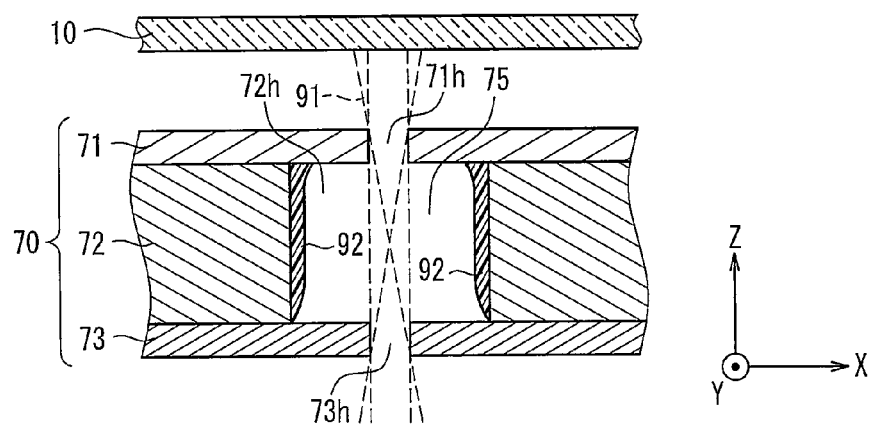
Figure 11C:
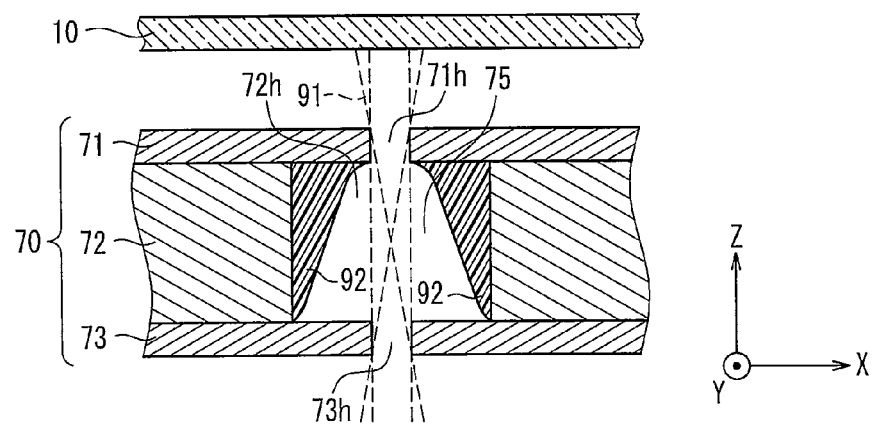

FIG. 11A is a cross-sectional view showing a state immediately after the start of forming a coating film 90 on the substrate 10 using the vapor deposition mask 70. Among the vapor deposition particles 91 that have entered the third opening 73h, those entered at a large incidence angle collide with and adhere to the inner circumferential surface of the mask opening 75, and thus cannot pass through the first opening 71h. Accordingly, when a certain length of time has elapsed after the start of vapor deposition, as shown in FIG. 11B, a vapor deposition material layer 92 is formed on the inner circumferential surface of the mask opening 75 as a result of the vapor deposition particles 91 adhering thereto. In the present embodiment, the opening dimension of the second opening 72h is larger than the opening dimension of the first opening 71h and is larger than the opening dimension of the third opening 73h, and therefore the vapor deposition material layer 92 is formed on the inner circumferential surface of the second opening 72h of the second layer 72 and the undersurface (the surface facing the second layer 72) of the first layer 71 around the first opening 71h. When another certain length of time has elapsed, as shown in FIG. 11C, the vapor deposition material layer 92 becomes thicker, but the effective opening dimension of the mask opening 75 will not be reduced, or clogging will not occur as a result of the mask opening 75 being blocked by the vapor deposition material layer 92.

Because the mask opening 75 is unlikely to be clogged, it is possible to increase the thickness (dimension in the Z axis direction) of the second layer 72. In other words, the thickness of the vapor deposition mask 70 can be set to 1.2 mm or greater, which is a desirable thickness described above, by forming the second layer 72 to be thicker than the first layer 71 and the third layer 73.

If the vapor deposition mask 70 is made thicker, the aspect ratio of the mask opening 75 increases, and thus the departure angle of the vapor deposition particles 91 that can pass through the mask opening 75 becomes smaller. As used herein, "departure angle" of the vapor deposition particles 91 is defined as the angle formed between the traveling direction of the vapor deposition particles 91 departing from the mask opening 75 and the Z axis on a projection onto the XZ plane. The departure angle of the vapor deposition particles 91 is determined by the first opening 71h of the first layer 71 and the third opening 73h of the third layer 73.

As described above, in the vapor deposition mask 70 of the present embodiment, the departure angle of the vapor deposition particles 91 that can pass through the mask opening 75 is limited by forming the second layer 72 to be thick. Specifically, only the vapor deposition particles 91 discharged from a limited number (preferably one) of vapor deposition source openings 61 located directly below a mask opening 75 are selectively allowed to pass through the mask opening 75. As a result, in the present embodiment, the upper limit value of the departure angle of the vapor deposition particles 91 departing from a mask opening 75 is smaller than that of the new vapor deposition method shown in FIGS. 5 and 6. Accordingly, even when the vapor deposition mask 70 and the substrate 10 are spaced apart from each other, the width We of the thickness tapered portion 990e shown in FIG. 7 can be reduced, and therefore the occurrence of a blur at both edges of the stripe-shaped coating film 90 is suppressed significantly.

Generally, the mask opening patterns of vapor deposition masks used in vapor deposition by color for light emitting layers 23R, 23G and 23B are required to have a precision of ±several tens of micrometers or less. In order to achieve such a precision, due to restrictions to processing and the like, the vapor deposition mask preferably has a thickness of 0.1 mm or less. In the present embodiment, the first layer 71 and the third layer 73 can be made thin (preferably 0.1 mm or less) while the high aspect ratio of the mask opening 75 is maintained, and therefore a precision satisfying the above required of the mask opening pattern can be achieved. The positional precision of the coating film 90 formed on the deposition surface 10e of the substrate 10 is thereby ensured.

Also, as a result of the first layer 71 and the third layer 73 being made thin, the vapor deposition particles 91 hardly adhere to the inner circumferential surface of the first opening 71h and the inner circumferential surface of the third opening 73h to such a degree that it causes a practical problem.

The second layer 72 is preferably thicker than the first layer 71 and the third layer 73, and more preferably thicker than the first layer 71 and the third layer 73 by 0.1 mm or greater. If the second layer 72 is made thick, due to restrictions to processing and the like, the pattern precision of the second opening 72h deteriorates. However, because the opening dimension of the second opening 72h is larger than the opening dimension of the first opening 71h and is larger than the opening dimension of the third opening, the second opening 72a does not affect the departure angle of the vapor deposition particles 91 departing from the mask opening 75. Accordingly, the relatively low pattern precision of the second opening 72h does not have harmful effects on the positional precision or the like of the coating film 90.

As described above, with the vapor deposition mask 70 of the present embodiment, a required mask opening pattern precision can be ensured by the first layer 71 and the third layer 73 that are relatively thin, and a high aspect ratio of the mask opening 75 can be ensured by the second layer 72 that is relatively thick. Accordingly, when the vapor deposition mask 70 is applied to the new vapor deposition method described above, it is possible to form a high-quality coating film with few blurs at both edges. It is also possible to prevent reduction of the opening dimension of the mask openings 75 or clogging of the mask openings 75 as a result of the vapor deposition particles 91 adhering to the mask openings 75.

It is sufficient that the opening dimension of the second opening 72h is larger than the opening dimensions of the first opening 71h and the third opening 73h. As shown in FIG. 11A, protruding lengths L1 and L3 between the edges of the first opening 71h and the third opening 73h and the inner circumferential surface of the second opening 72h can be set by taking into consideration an expected thickness of the vapor deposition material layer 92 and the like, but are preferably set to 0.2 mm or greater. However, if the protruding lengths L1 and L3 are too large, the edge of the first opening 71h and the edge of the third opening 73h may be deformed by gravity or the like, as a result of which the interval between the first opening 71h and the third opening 73h in the Z axis direction changes. It is possible to, for example, set the opening dimension in the X axis direction of the first opening 71h and the opening dimension in the X axis direction of the third opening 73h to approximately 100 µm and the opening dimension in the X axis direction of the second opening 72h to approximately 1 mm or greater.

The thickness tapered portion 990e discussed in connection to FIG. 7 is formed on both edges in the X axis direction of the coating film. Accordingly, in the present invention, in at least the X axis direction (width direction), the opening dimension of the second opening 72h needs to be larger than the opening dimensions of the first opening 71h and the third opening 73h. However, in the Y axis direction (lengthwise direction) as well, it is preferable that the opening dimension of the second opening 72h is larger than the opening dimension of the first opening 71h and is larger than the opening dimension of the third opening 73h. This prevents the occurrence of problems such as, as a result of the vapor deposition material layer 92 being formed on the inner circumferential surface of the mask opening 75, the opening dimension in the Y axis direction of the mask opening 75 is reduced and the coating film 90 becomes thin.

In the above embodiment, as shown in FIG. 12A, in the vapor deposition mask 70, a plurality of slit-shaped mask openings 75 that are parallel to each other and extend in the X axis direction. However, the mask opening pattern formed in the vapor deposition mask 70 is not limited thereto, and any mask opening pattern can be set as long as stripe-shaped coating films 90 parallel to the Y axis direction can be formed on the deposition surface 10e of the substrate 10.

Figure 12B:
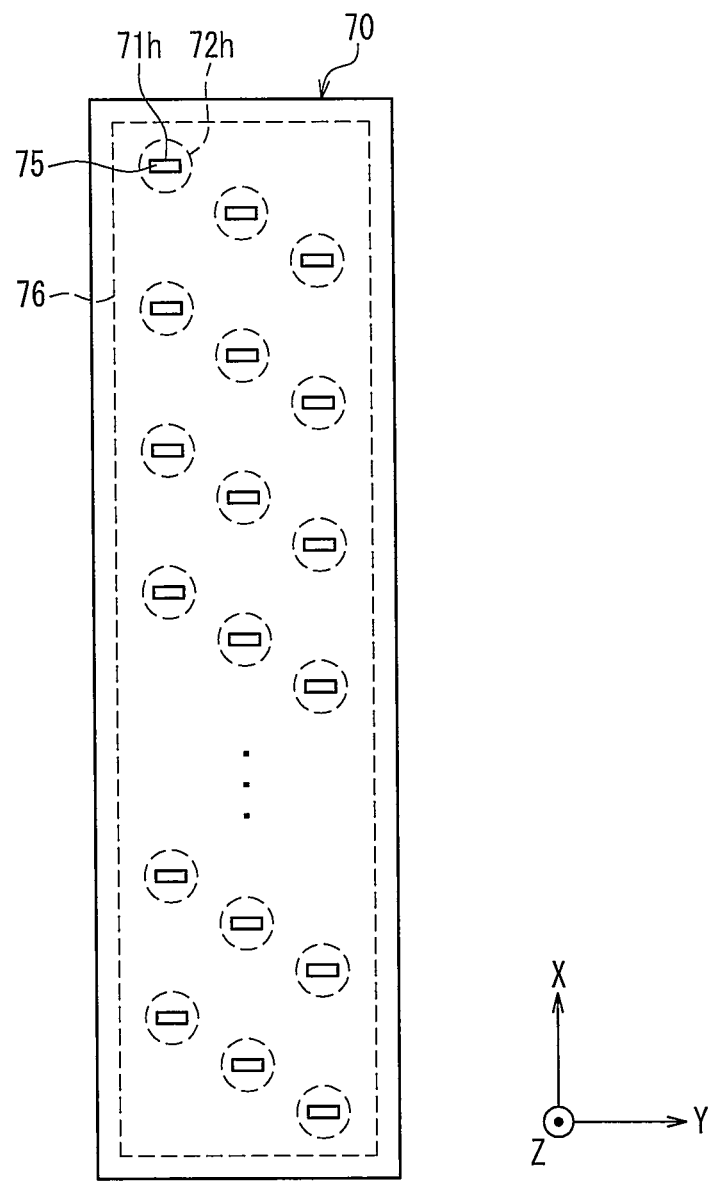
FIG. 12B is a plan view showing another example of a mask opening pattern of the vapor deposition mask according to Embodiment 1 of the present invention.
Figure 12C:
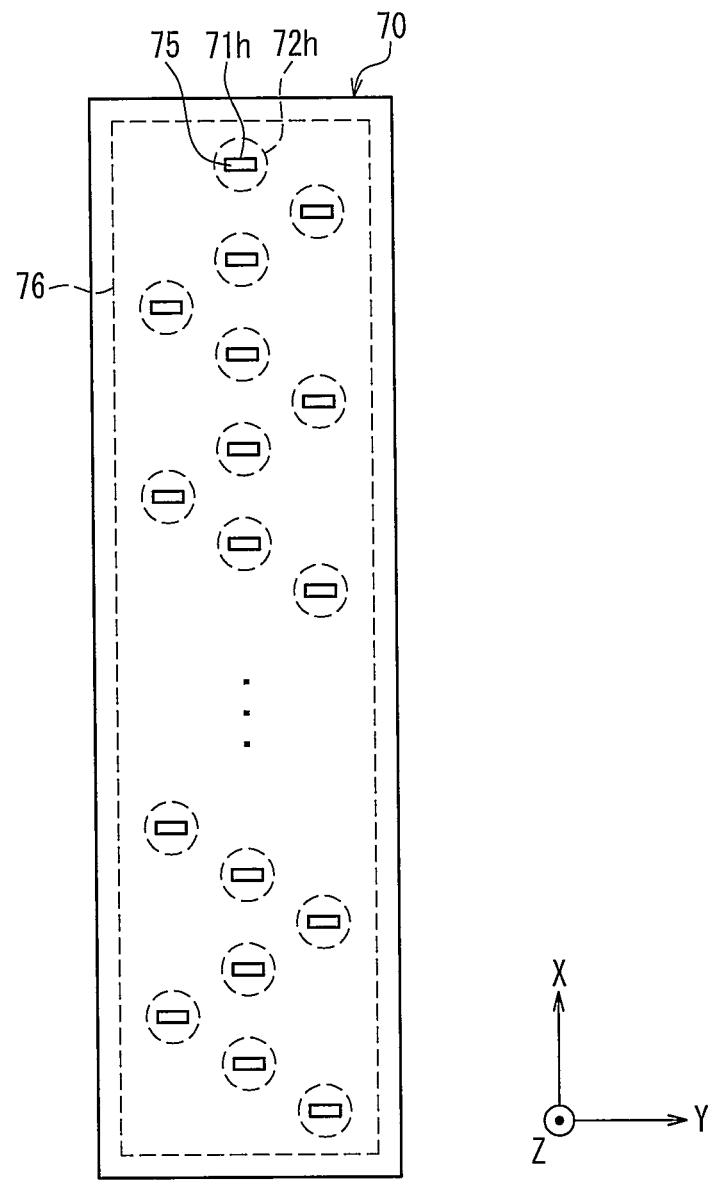
FIG. 12C is a plan view showing still another example of a mask opening pattern of the vapor deposition mask according to Embodiment 1 of the present invention.
Figure 12D:
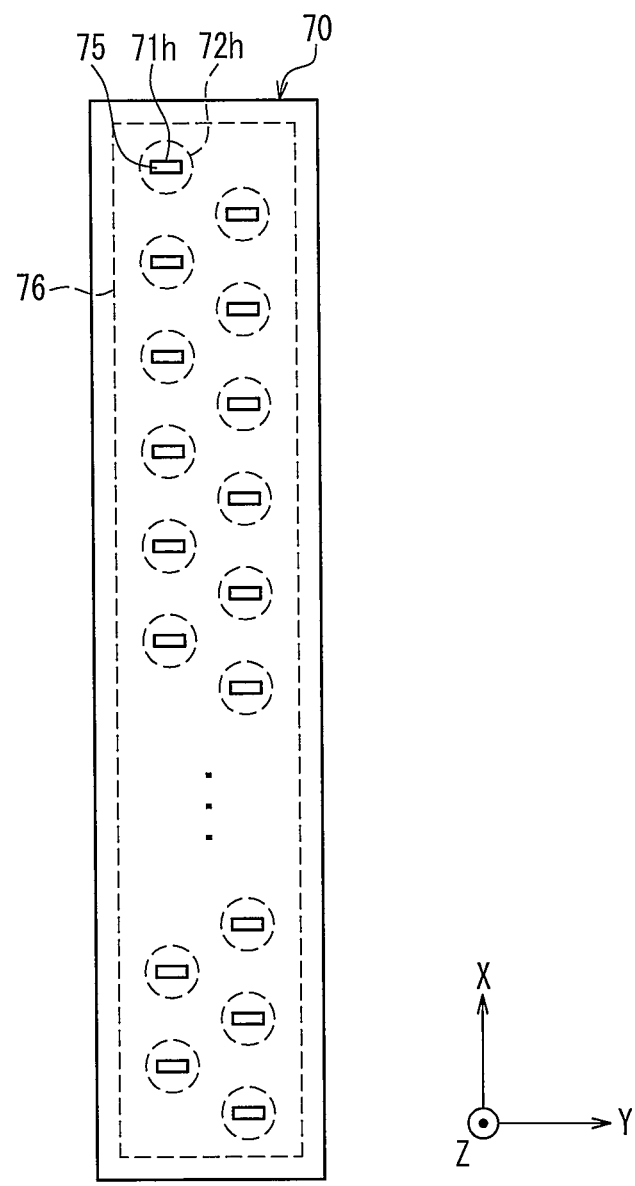
FIG. 12D is a plan view showing still another example of a mask opening pattern of the vapor deposition mask according to Embodiment 1 of the present invention.

For example, the mask openings 75 may be arranged in a saw-like arrangement as shown in FIG. 12B, a triangular wave arrangement as shown in FIG. 12C or a staggered arrangement as shown in FIG. 12D. These mask opening pattern is preferably used when coating films 90 are to be formed at a small pitch in the X axis direction, and if a plurality of mask openings 75 are arranged in the X axis direction, neighboring second openings 72h that are adjacent in the X axis direction interfere with each other.

Figure 12E:
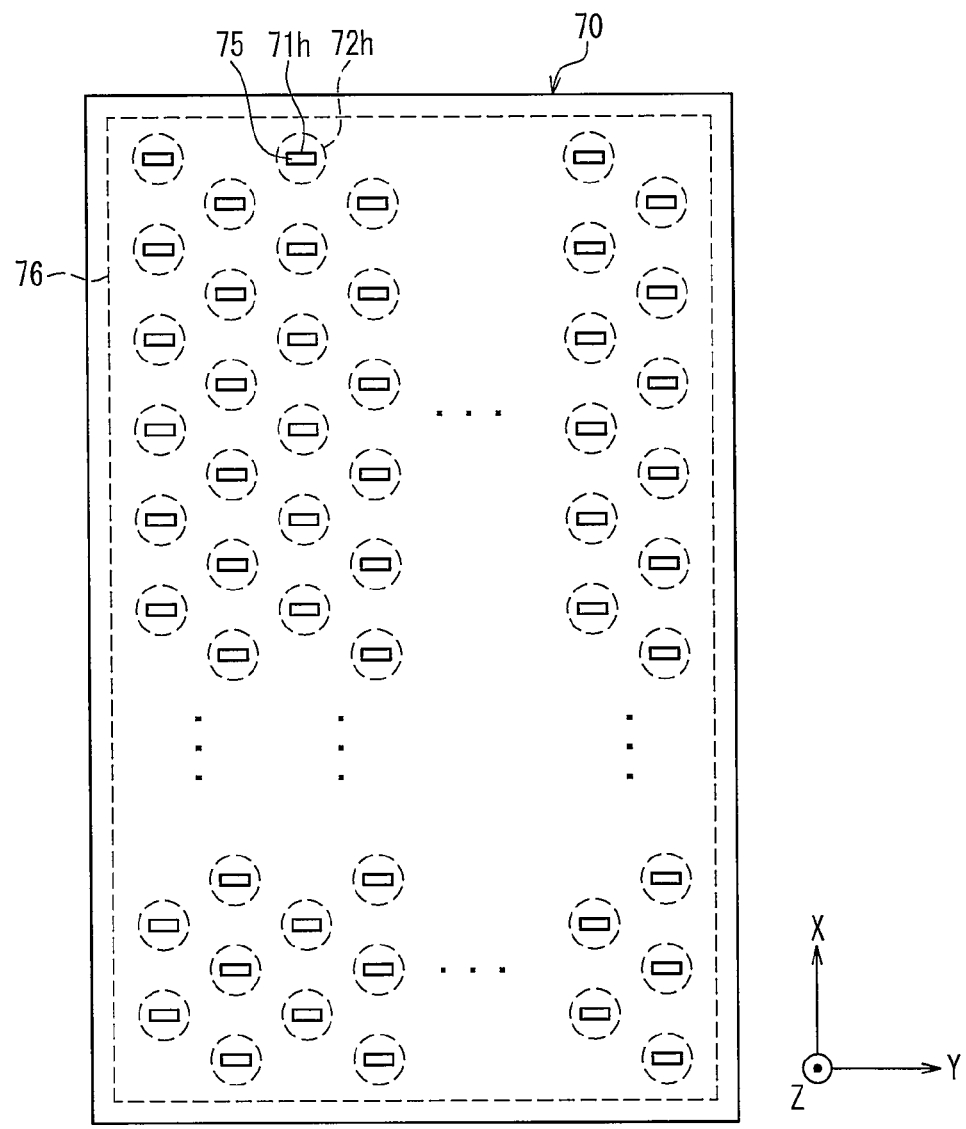
FIG. 12E is a plan view showing still another example of a mask opening pattern of the vapor deposition mask according to Embodiment 1 of the present invention.

Alternatively, as shown in FIG. 12E, the staggered arrangement patterns of mask openings 75 shown in FIG. 12D may be disposed in a plurality of columns in the Y axis direction. In this case, a plurality of mask openings 75 are arranged at the same position in the X axis direction, and the plurality of mask openings 75 form a common coating film 90. In FIG. 12E, the pattern shown in FIG. 12D is disposed in a plurality of columns in the Y axis direction, but any of the patterns shown in FIG. 12A to 12C may be disposed in a plurality of columns in the Y axis direction.

The mask opening pattern formed in the vapor deposition mask 70 is not limited to the above examples, and any pattern can be used.

In FIGS. 12A to 12E, a dotted rectangle 76 indicates where spot welding for fixing the first layer 71, the second layer 72 and the third layer 73 has been performed.

In FIGS. 12A to 12E, the first opening 71h, the second opening 72h and the third opening 73h are in one-to-one correspondence with each other. However, in the present invention, it is sufficient that the position in the X axis direction matches between the first opening 71h and the third opening 73h. For example, in the case where the first opening 71h and the third opening 73h are disposed so as to be spaced apart from each other in the X axis direction to such a degree that the vapor deposition particles 91 that have passed through the first opening 71h cannot enter the third opening 73h disposed at a position in the X axis direction different from the first opening 71h, in a single common second opening 72h, a plurality of first openings 71h and a plurality of third openings 73h may be formed. It is preferable to arrange the first opening 71h and the third opening 73h so as to be in one-to-one correspondence with each other because manufacturing of the vapor deposition mask 70 is facilitated.

The shape of the individual mask openings 75 formed in the vapor deposition mask 70 is not necessarily a slit shape extending in the X axis direction. The dimension in the X axis direction of the mask openings 75 (the first opening 71h and the third opening 73h in particular) affects the dimension (width) in the X axis direction of the stripe-shaped coating film 90, and the dimension in the Y axis direction of the mask openings 75 (the first opening 71h and the third opening 73h in particular) affects the thickness of the stripe-shaped coating film 90.

Figure 13A:
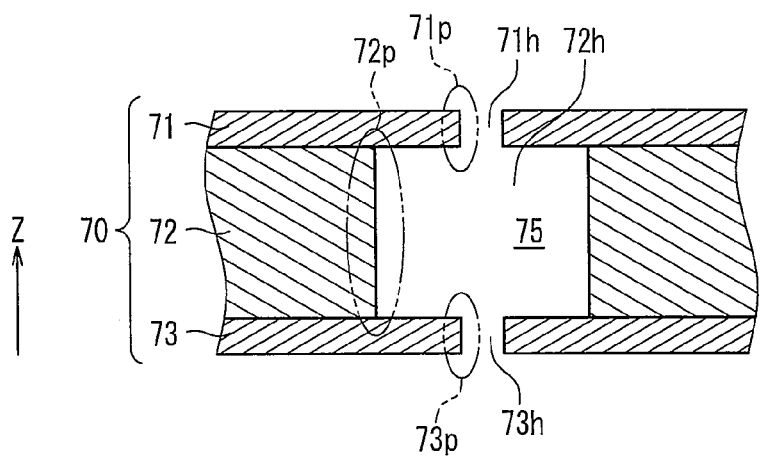
FIG. 13A is an enlarged cross-sectional view showing a mask opening and a peripheral portion thereof in the vapor deposition mask according to Embodiment 1 of the present invention.
Figure 13B:
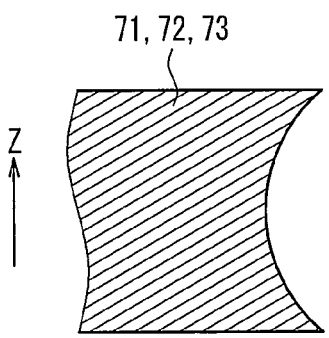
FIGS. 13B to 13E are cross-sectional views showing other examples of cross-sectional shapes of the inner circumferential surfaces of first openings, second openings and third openings.
Figure 13C:
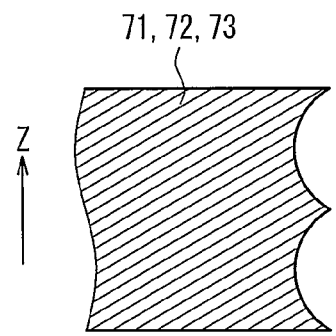
Figure 13D:
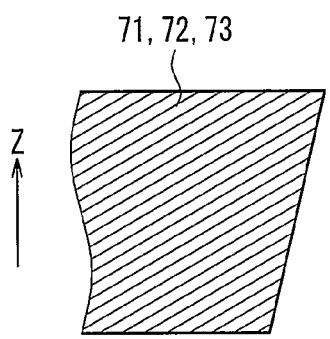
Figure 13E:
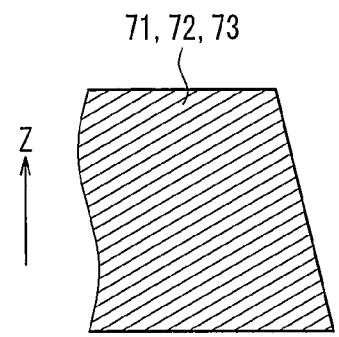

In FIGS. 10 and 11, the inner circumferential surfaces of the first opening 71h, the second opening 72h and the third opening 73h are illustrated such that the opening dimension is constant in the Z axis direction, but the present invention is not limited thereto. Specifically, in a cross section of the vapor deposition mask 70 in FIG. 13A showing a mask opening 75 and the peripheral portion thereof, at least one of a portion 71p including the inner circumferential surface of the first opening 71h, a portion 72p including the inner circumferential surface of the second opening 72h and a portion 73p including the inner circumferential surface of the third opening 73h has a cross-sectional shape shown in, for example, FIGS. 13B to 13E. In FIG. 13B, the opening dimension is smallest at both ends in the Z axis direction. In FIG. 13C, the opening dimension is smallest at three different portions in the Z axis direction. In FIG. 13D, the opening dimension is smallest at the upper end (the end on the substrate 10 side) in the Z axis direction. In FIG. 13E, the opening dimension is smallest at the lower end (the end on the vapor deposition source 60 side) in the Z axis direction. The cross-sectional shapes of the inner circumferential surfaces of the first opening 71h, the second opening 72h and the third opening 73h can vary depending on, for example, the opening forming method. The dimensions of the first opening 71h, the second opening 72h and the third opening 73h are each defined by the smallest of the opening dimension.

The above embodiment has illustrated an example in which the vapor deposition mask 70 is composed of three layers, namely, the first layer 71, the second layer 72 and the third layer 73, but the present invention is not limited thereto. For example, the second layer 72 between the first layer 71 and the third layer 73 that constitute surface layers may be composed of a plurality of layers. In this case, it is sufficient that the second openings formed in the plurality of layers constituting the second layer 72 have an opening dimension larger than the opening dimensions of the first opening 71h and the third opening 73h.

There is no particular limitation on the material for the first layer 71, the second layer 72 and the third layer 73 that constitute the vapor deposition mask 70, but in order to reduce dimensional change (expansion) and deformation of the vapor deposition mask 70 due to heat during vapor deposition, it is preferable to use a material having a generally small thermal expansion coefficient. This is because, if a dimensional change or deformation occurs in the vapor deposition mask 70, the coating films 90 that are formed on the deposition surface 10e of the substrate 10 will be out of position. Table 1 shows materials that can be used for the first layer 71, the second layer 72 and the third layer 73 and the thermal expansion coefficients of the materials

TABLE 1

| Name of Material | Thermal Expansion Coefficient $(\times 10^{-6}/°C.)$ |
| --- | --- |
| Iron (Fe) | 12.1 |
| Chromium (Cr) | 6.8 |
| SUS 304 | 17.3 |
| Alkali-free glass | 3.8 |

TABLE 1-continued

| Name of Material | Thermal Expansion Coefficient ($\times 10^{-6}$/C. °) |
|---|---|
| Polyimide | 20 to 30 |
| Invar material | 1 to 2 |
| Titanium (Ti) | 8.4 |
| Tungsten (W) | 4.3 |
| Tantalum (Ta) | 6.3 |
| Molybdenum (Mo) | 5.3 |
| Nickel (Ni) | 12.8 |

For example, if all of the first layer 71, the second layer 72 and the third layer 73 are made of invar material, it is possible to achieve a vapor deposition mask 70 that is unlikely to undergo dimensional change or deformation (for example, warping) due to heat during vapor deposition.

The first layer 71, the second layer 72 and the third layer 73 are not necessarily made of the same material. However, if the first layer 71, the second layer 72 and the third layer 73 have different thermal expansion coefficients, there is a possibility that the vapor deposition mask 70 may be warped by heat during vapor deposition, so that the first layer 71 or the third layer 73 is convexly curved. Accordingly, it is preferable that the first layer 71 and the third layer 73 that constitute surface layers of the vapor deposition mask 70 have the same thermal expansion coefficient, or that the difference in thermal expansion coefficient between the first layer 71 and the third layer 73 is small. More preferably, at least the first layer 71 and the third layer 73 are made of the same material. For example, alkali-free glass can be used as a material of the second layer 72, and polyimide can be used as materials of the first layer 71 and the third layer 73. It is thereby possible to prevent the vapor deposition mask 70 from warping by heat during vapor deposition.

It is preferable that the materials for the first layer 71, the second layer 72 and the third layer 73 are selected taking into consideration the method for forming the first opening 71h, the second opening 72h and the third opening 73h, and the like, in addition to the thermal expansion coefficient.

<Method for Manufacturing Vapor Deposition Mask>

A method for manufacturing the vapor deposition mask 70 will be described. It should be noted, however, that the following manufacturing method is merely an example, and the vapor deposition mask 70 can of course be manufactured by methods other than the following manufacturing method.

[Manufacturing Method 1]

According to the manufacturing method 1, a first layer 71 having first openings 71h formed therein, a second layer 72 having second openings 72h formed therein, and a third layer 73 having third openings 73h formed therein are separately and individually made, and then these layers are bonded together. The first layer 71, the second layer 72 and the third layer 73 can be made in any order.

FIGS. 14A to 14D are enlarged cross-sectional views illustrating the steps of the manufacturing method 1 for the vapor deposition mask 70 in order.

Figure 14A:
FIGS. 14A to 14D are enlarged cross-sectional views illustrating the steps of an example of a method for manufacturing the vapor deposition mask according to Embodiment 1 of the present invention in order.
Figure 14B:
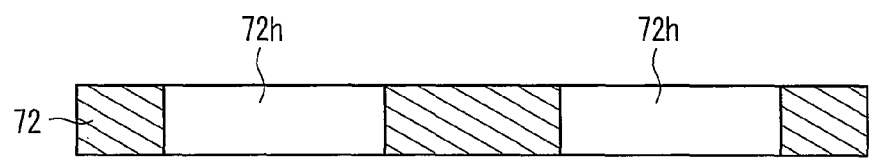
Figure 16A:
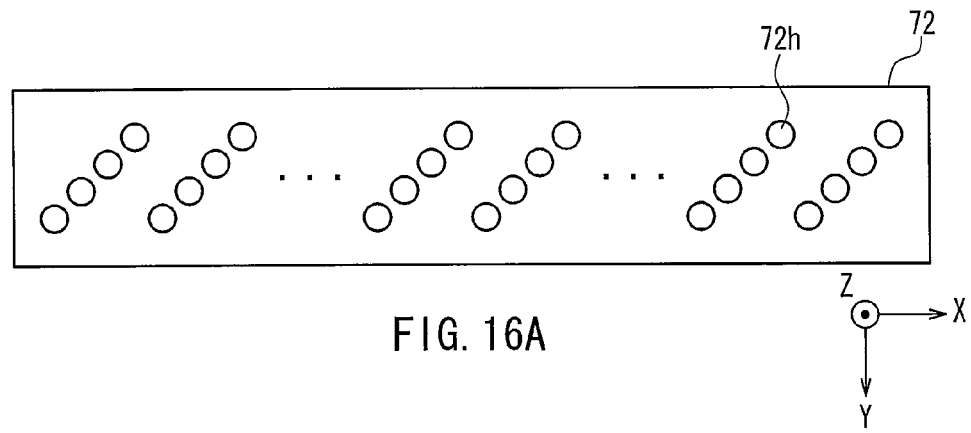
FIG. 16A is a plan view of the second layer shown in FIG. 14B.

A method for manufacturing the second layer 72 will be described. As shown in FIG. 14A, a thick board 72a for making the second layer 72 is prepared. As an example, an invar material having a thickness of 5 mm and a nickel content of 36 wt % can be used as the thick board 72a. The thick board 72a is drilled by an NC machine (Numerical Control Machining) so as to form through holes serving as second openings 72h in a predetermined pattern. FIG. 14B is an enlarged cross-sectional view of the second layer 72 in which second openings 72h have been formed, and FIG. 16A is a plan view thereof. In this example, in order to avoid interference between neighboring second openings 72h due to the pitch in the X axis direction between coating films 90 that are to be formed on the substrate 10 being small, as shown in FIG. 16A, second openings 72h are arranged in a saw-like arrangement.

Figure 15:
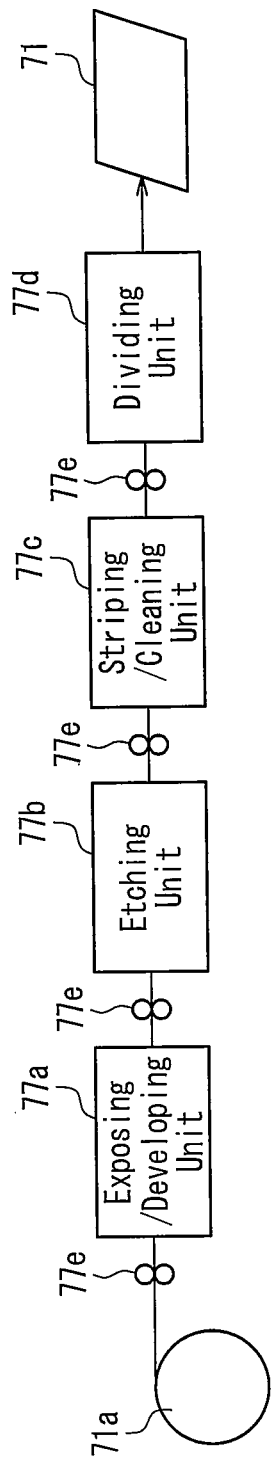
FIG. 15 is a schematic diagram illustrating a method for manufacturing a first layer and a third layer that constitute the vapor deposition mask according to Embodiment 1 of the present invention.

A method for manufacturing the first layer 71 and the third layer 73 will be described. FIG. 15 is a schematic view showing the method for manufacturing the first layer 71 and the third layer 73. Hereinafter, a method for manufacturing the first layer 71 will be described, but the third layer 73 can be manufactured by the same method.

First, a rolled wound item around which a thin board 71a for making the first layer 71 has been wound is prepared. As an example, a long invar material having a thickness of 50 μm and a nickel content of 36 wt % can be used as the thin board 71a. The thin board 71a is fed from the wound item and then successively passes through an exposing/developing unit 77a, an etching unit 77b, a striping/cleaning unit 77c and a dividing unit 77d. Between these (each adjacent pair of?) units, nip rolls 77e are provided that hold the thin board 71a by being in close contact with both surfaces of the thin board 71a, in order to adjust the tension of the thin board 71a or to prevent the thin board 71a from meandering.

In the exposing/developing unit 77a, a known photo process is performed. Specifically, a photoresist is applied to the thin board 71a by a slit coating method. Next, the thin board 71a is exposed in a predetermined pattern with an exposing device, and then developed with a weak alkaline solution, whereby a predetermined resist pattern is formed on the thin board 71a.

Next, in the etching unit 77b, the thin board 71a is etched in a predetermined pattern by using a ferric chloride solution. Through holes are thereby formed in the thin board 71a, and the through holes will serve as first openings 71h.

Next, in the striping/cleaning unit 77c, the photoresist on the thin board 71a is stripped off by using a strong alkaline solution, washed with pure water and subjected to nitrogen blow.

Figure 16B:
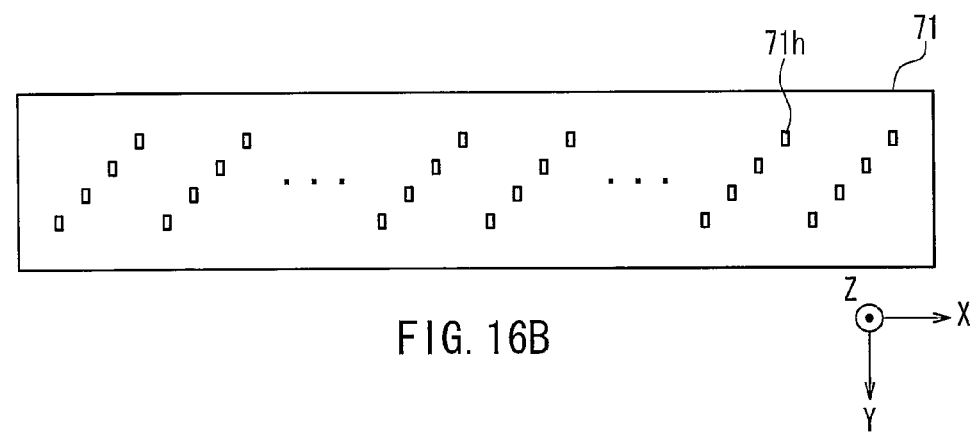
FIG. 16B is a plan view of a first layer obtained by the method illustrated in FIG. 15.

Next, in the dividing unit 77d, the thin board 71a is cut to a predetermined size with a metal cutting tool so as to leave the area where a plurality of first openings 71h have been formed. As a result, a first layer 71 as shown in FIG. 16B is obtained. The position of the first openings 71h formed in the first layer 71 is the same as that of the second openings 72h of the second layer 72 shown in FIG. 16A, but the opening dimension of the first openings 71h is smaller than that of the second openings 72h.

The third layer 73 can be manufactured by the same method as that used for the first layer 71. The opening dimension and position can be matched between the first openings 71h and the third openings 73h by using the same photomask on the first layer 71 and the third layer 73 in the exposing/developing unit 77a.

Figure 14C:
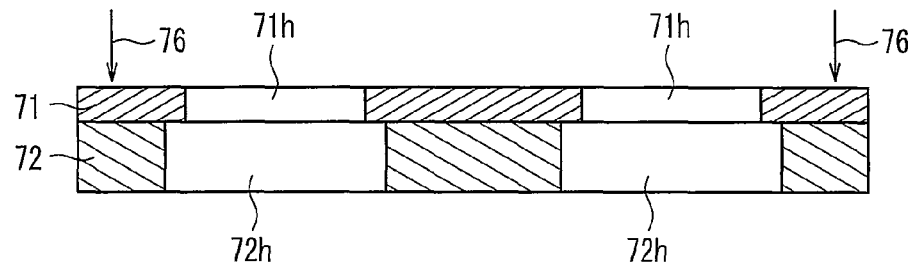

Next, as shown in FIG. 14C, the first layer 71 is positioned and disposed on one side of the second layer 72 and then fixed by spot welding. At this time, it is preferable that the first layer 71 and the second layer 72 are spot-welded 76 while the periphery of the first layer 71 is outwardly pulled to prevent sagging from occurring in the first layer 71.

Figure 16C:
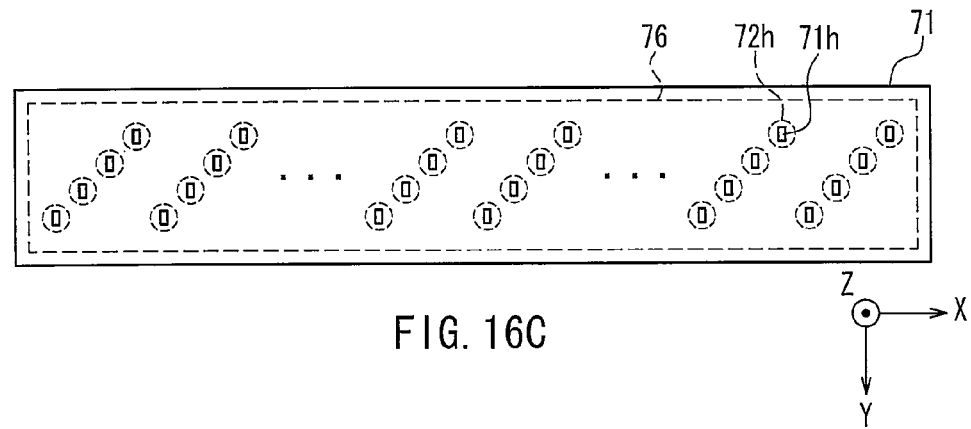
FIG. 16C is a plan view showing a state in which the first layer has been bonded onto the second layer shown in FIG. 14C.

FIG. 16C is a plan view showing that the first layer 71 has been fixed onto the second layer 72. A surrounding dotted rectangle 76 indicates where spot welding for fixing the first layer 71 and the second layer 72 has been performed. It is preferable that spot welding 76 is performed outside the area where the first and second openings 71h and 72h have been formed.

Next, the unitary article in which the first layer 71 and the second layer 72 have been integrated is turned upside down, and the third layer 73 is positioned and disposed on the other side of the second layer 72 and then fixed by spot welding 76. The third layer 73 can be spot-welded by the same spot welding method as that used for the first layer 71 described with reference to FIG. 14C.

Figure 14D:
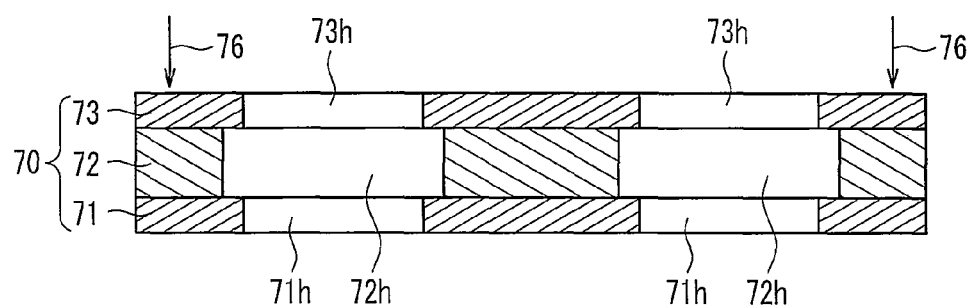

As a result, as shown in FIG. 14D, a vapor deposition mask 70 according to the present embodiment is obtained.

In the manufacturing method 1 described above, the first layer 71 was first welded to the second layer 72 and then the third layer 73 was welded, but the third layer 73 may be welded first.

[Manufacturing Method 2]

According to the manufacturing method 2, a thin board 71a in which first openings 71h have not been formed and a thin board 73a in which third openings 73h have not been formed are bonded respectively to both sides of a second layer 72 in which second openings 72h have been formed, and then through holes are formed in both the thin boards 71a and 73a.

FIGS. 17A to 17E are enlarged cross-sectional view illustrating the steps of the manufacturing method 2 for the vapor deposition mask 70 in order.

Figure 17A:
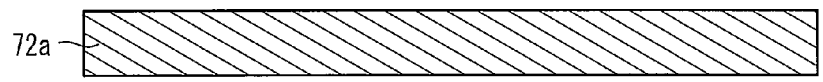
FIGS. 17A to 17E are enlarged cross-sectional views illustrating the steps of another example of a method for manufacturing the vapor deposition mask according to Embodiment 1 of the present invention in order.

First, as shown in FIG. 17A, a thick board 72a for making the second layer 72 is prepared. As an example, the same material as that used for the thick board 72a described in the manufacturing method 1 with reference to FIG. 14A, namely, an invar material having a thickness of 5 mm and a nickel content of 36 wt %, can be used as the thick board 72a.

Figure 17B:

Next, as shown in FIG. 17B, through holes serving as second openings 72h are formed in a predetermined pattern in the thick board 72a, whereby a second layer 72 is obtained. The second openings 72h may be formed by the same method as that described in the manufacturing method 1 with reference to FIG. 14B.

Figure 17C:
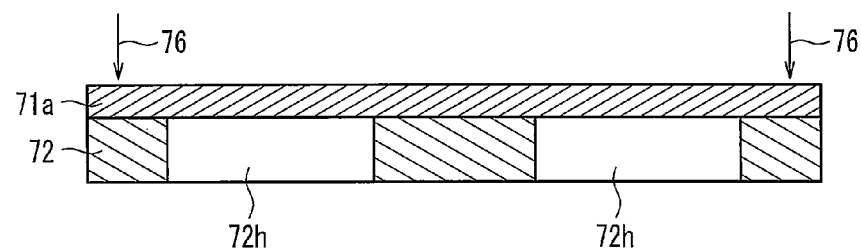

Next, as shown in FIG. 17C, the thin board 71a serving as the first layer 71 is disposed on one side of the second layer 72 and then fixed by spot welding 76. As an example, an invar material having a thickness of 50 μm and a nickel content of 36 wt % can be used as the thin board 71a. The thin board 71a is cut in a predetermined shape in advance. Unlike the manufacturing method 1, first openings 71h have not been formed in the thin board 71a. As is the case with the manufacturing method 1 described with reference to FIG. 14C, it is preferable that the thin board 71a and the second layer 72 are spot-welded 76 while the periphery of the thin board 71a is outwardly pulled to prevent sagging from occurring in the thin board 71a.

Figure 17D:
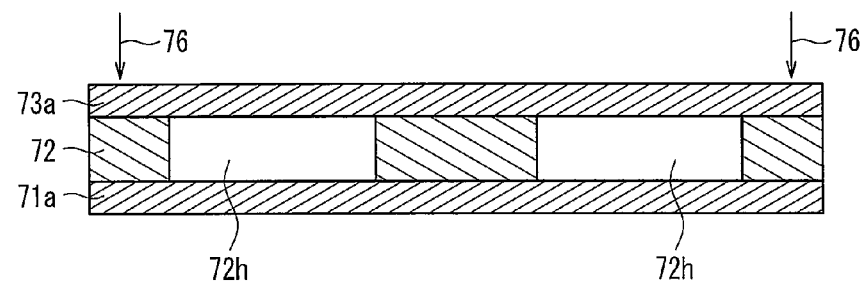

Next, the unitary article in which the thin board 71a and the second layer 72 have been integrated is turned upside down. As shown in FIG. 17D, the thin board 73a serving as the third layer 73 is disposed on the other side of the second layer 72 and then fixed by spot welding 76. As the thin board 73a, the same material as that used for the thin board 71a can be used. Also, the thin board 73a can be spot-welded by the same spot welding method performed on the thin board 71a.

Figure 17E:
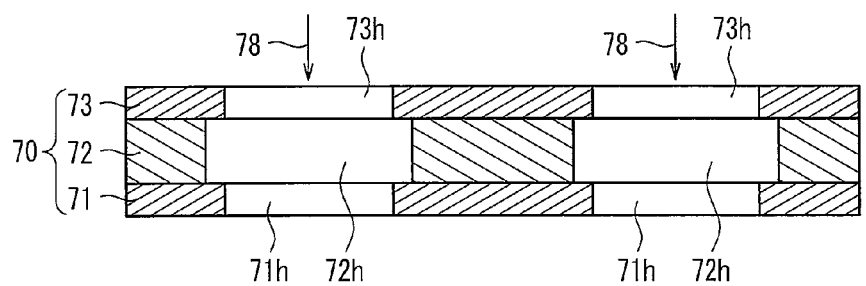

Next, as shown in FIG. 17E, through holes are formed in the thin boards 71a and 73a by application of laser light 78 to predetermined positions with the use of a laser processing machine capable of performing precise position control. The laser light 78 can be applied from either of the thin boards 71a and 73a. As an example, a 300 W YAG laser can be used as the laser light source. The formed through holes serve as the first openings 71h and the third opening 73h. In the case where dust is present at the edge of the through holes as a result of processing, the dust can be removed by performing, after forming the through holes, washing with pure water, nitrogen blow and application of heat at 120° C. in an oven in the atmosphere for 30 minutes.

As a result, a vapor deposition mask 70 of the present invention is obtained.

In the manufacturing method 2 described above, the thin board 71a was first welded to the second layer 72 and then the thin board 73a was welded, but the thin board 73a may be welded first.

In the manufacturing methods 1 and 2 described above, an invar material having a small thermal expansion coefficient was used as materials of the first layer 71, the second layer 72 and the third layer 73, but the composition of the invar material may be different from the above composition. It is also possible to use materials other than the invar material. The first layer 71, the second layer 72 and the third layer 73 are not necessarily made of the same material, and at least one of them may be made of a different material. However, it is necessary to use materials in which openings 71h, 72h, 73h can be formed.

Embodiment 2

In Embodiment 1, the first openings 71h and the third openings 73h of the vapor deposition mask 70 had the same opening dimension, whereas in Embodiment 2, the first openings 71h and the third openings 73h of the vapor deposition mask 70 have different opening dimensions. The present embodiment is the same as Embodiment 1 except for this difference. The present embodiment will be described, focusing on the difference from Embodiment 1.

Figure 18A:
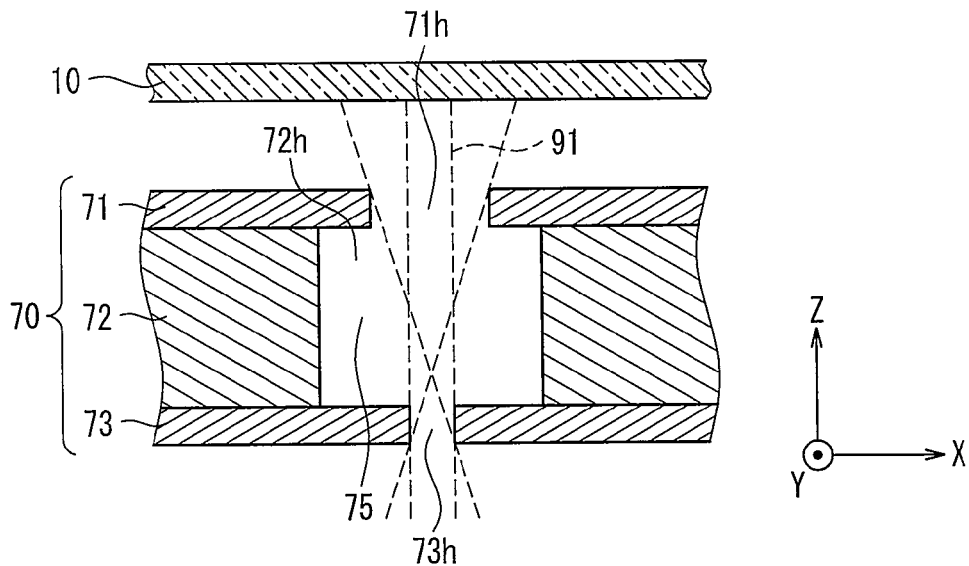
FIG. 18A is an enlarged cross-sectional view showing vapor deposition particles passing through a mask opening of a vapor deposition mask according to Embodiment 2 of the present invention.

FIG. 18A is an enlarged cross-sectional view showing vapor deposition particles 91 passing through a mask opening 75 of a vapor deposition mask according to the present embodiment. In FIG. 18A, the opening dimension of a first opening 71h formed in a first layer 71 disposed on the substrate 10 side is larger than that of a third opening 73h formed in a third layer 73 disposed on the vapor deposition source 60 side (see FIG. 9). As in Embodiment 1, the opening dimension of a second opening 72h formed in a second layer 72 is larger than the opening dimensions of the first opening 71h and the third opening 73h.

The vapor deposition particles 91 discharged from the vapor deposition source are sorted when the particles pass through the third opening 73h having a relatively small opening dimension. The vapor deposition particles 91 that have entered the third opening 73h at a large incidence angle and passed therethrough mostly collide with and adhere to the inner circumferential surface of the second opening 72h of the second layer 72 or the undersurface (the surface facing the second layer 72) of the first layer 71 around the first opening 71h, and thus cannot pass through the first opening 71h. As in Embodiment 1, the opening dimension of the second opening 72h is larger than the opening dimensions of the first opening 71h and the third opening 73h, and therefore reduction of the opening dimension of the mask openings 75 or clogging of the mask openings 75 as a result of the vapor deposition particles 91 adhering to the inner circumferential surface of the mask openings 75 does not occur.

Figure 18B:
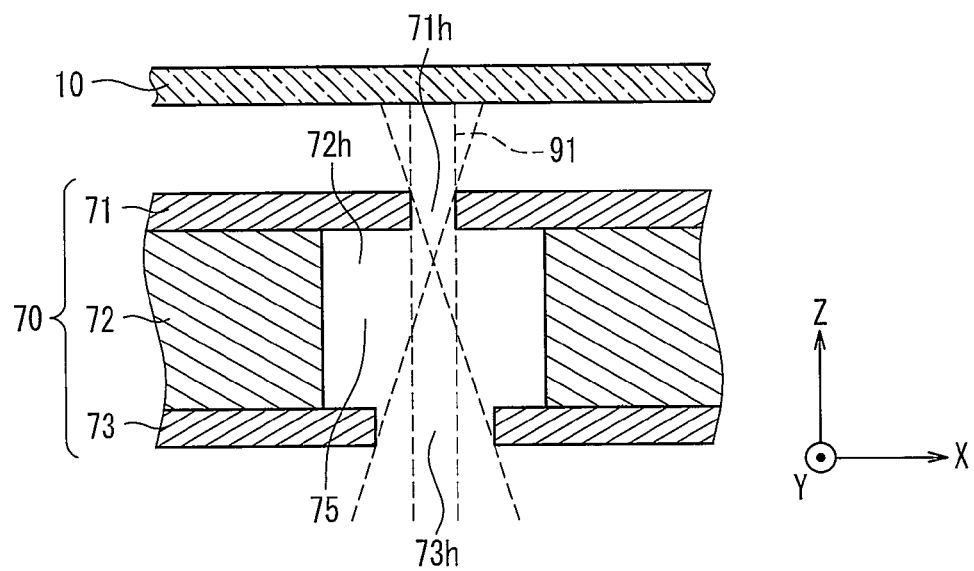
FIG. 18B is an enlarged cross-sectional view showing vapor deposition particles passing through a mask opening of another vapor deposition mask according to Embodiment 2 of the present invention.

FIG. 18B is an enlarged cross-sectional view showing vapor deposition particles 91 passing through a mask opening 75 of another vapor deposition mask 70 according to the present embodiment. Unlike FIG. 18A, in FIG. 18B, the opening dimension of a first opening 71h formed in a first layer 71 disposed on the substrate 10 side is smaller than that of a third opening 73h formed in a third layer 73 disposed on the vapor deposition source 60 side (see FIG. 9). As in Embodiment 1, the opening dimension of a second opening 72h formed in a second layer 72 is larger than the opening dimensions of the first opening 71h and the third opening 73h.

In this example, the opening dimension of the third opening 73h is larger than that of FIG. 18A, and thus a relatively large amount of vapor deposition particles 91 pass through the third opening 73h. However, because the opening dimension of the first opening 71h is small, the vapor deposition particles 91 that have entered the third opening 73h at a large incidence angle and passed therethrough mostly collide with and adhere to the inner circumferential surface of the second opening 72h of the second layer 72 or the undersurface (the surface facing the second layer 72) of the first layer 71 around the first opening 71h, and thus cannot pass through the first opening 71h. As in Embodiment 1, the opening dimension of the second opening 72h is larger than the opening dimensions of the first opening 71h and the third opening 73h, and therefore reduction of the opening dimension of the mask openings 75 or clogging of the mask openings 75 as a result of the vapor deposition particles 91 adhering to the inner circumferential surface of the mask openings 75 does not occur.

As in Embodiment 1, in FIGS. 18A and 18B as well, the vapor deposition particles 91 that have entered the third opening 73h at a large incidence angle cannot pass through the first opening 71h, and therefore the occurrence of a blur at both edges of the coating film 90 formed on the substrate 10 is suppressed significantly. In FIGS. 18A and 18B, the width We of the thickness tapered portion 990e shown in FIG. 7 is slightly greater than that of Embodiment 1, but it can be suppressed to such a degree that it does not cause a practical problem, by increasing the thickness of the second layer 72.

In FIG. 18B, the first opening 71h located at a position closest to the substrate 10 has a small opening dimension. Accordingly, if the departure angle of the vapor deposition particles 91 passing through the first opening 71h is the same, in FIG. 18B, the width We of the thickness tapered portion 990e shown in FIG. 7 is smaller than that of FIG. 18A.

A method for manufacturing the vapor deposition mask 70 of the present embodiment will be described. It should be noted, however, that the following manufacturing method is merely an example, and the vapor deposition mask 70 can of course be manufactured by methods other than the following manufacturing method.

FIGS. 19A to 19F are enlarged cross-sectional view illustrating the steps of an example of a method for manufacturing the vapor deposition mask 70 of the present embodiment in order.

Figure 19A:
FIGS. 19A to 19F are enlarged cross-sectional views illustrating the steps of an example of a method for manufacturing the vapor deposition mask according to Embodiment 2 of the present invention in order.

First, as shown in FIG. 19A, a thick board 72a serving as the second layer 72 is prepared. As the thick board 72b, for example, an alkali-free glass substrate can be used. As an example, a 0.7 mm thick 1737 substrate available from Corning Corporation can be used. It is preferable that the thick board 72b is subjected to, in advance, a process such as IPA ultrasonic cleaning or pure water cleaning to remove foreign materials such as organic matter therefrom.

Figure 19B:
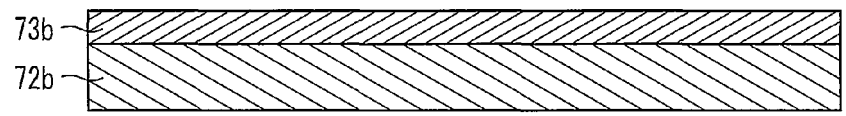

Next, as shown in FIG. 19B, a photosensitive resin layer 73b is formed on one side of the thick board 72b. As an example, photosensitive polyimide DL-1000 available from Toray Industries, Inc. can be applied by a spin coating method. The spin coating can be performed at a spinning speed of, for example, 1300 rpm for 8 seconds. After that, it is preferable to perform pre-baking at 120° C. for 2 minutes using a hot plate.

Figure 19C:
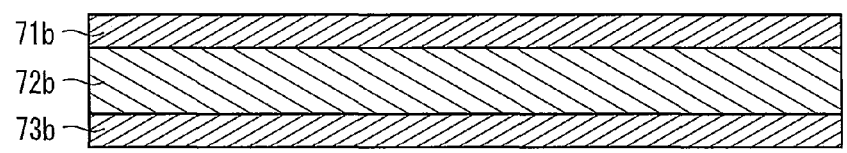

Next, as shown in FIG. 19C, the thick board 72b is turned upside down, and a photosensitive resin layer 71b is formed on the other side of the thick board 72b. The photosensitive resin layer 71b can be formed by using the same material and the same method as those used for the photosensitive resin layer 73b.

Figure 19D:
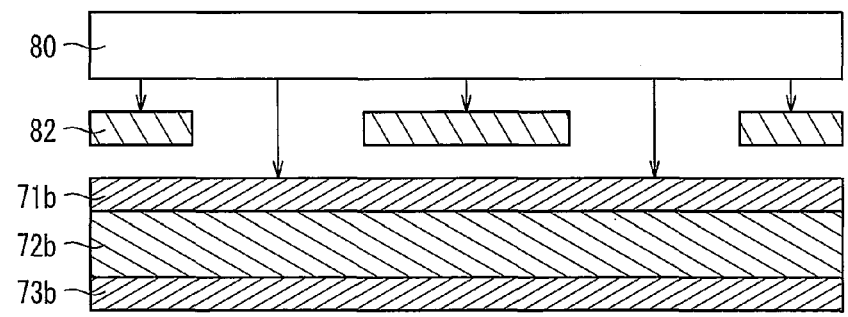

Next, as shown in FIG. 19D, the thick board 72b is exposed in a predetermined pattern via an exposure mask 82 by using an exposure lamp 80. As an example, the amount of exposure is 100 mJ/cm$^2$.

Figure 19E:
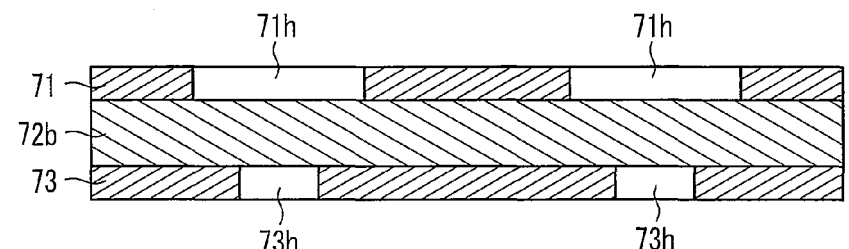

Next, as shown in FIG. 19E, the thick board 72b is developed with an alkaline solution so as to remove the photosensitive resin layers 71b and 73b in the exposed area. As an example, the developer can be a 2.38% TMAH (tetramethyl ammonium hydroxide), and the development time can be set to 30 seconds. In the exposure step shown in FIG. 19D, because the photosensitive resin layer 71b disposed on the exposure lamp 80 side is directly exposed to light, and thus the exposure intensity is higher than that of the photosensitive resin layer 73b that is exposed to light via the photosensitive resin layer 71b and the thick board 72b. Accordingly, openings larger than those of the photosensitive resin layer 73b are formed in the photosensitive resin layer 71b. After that, post-baking is performed. As an example, the post-baking can be performed at 220° C. in an oven in the atmosphere for 1 hour. As a result, the photosensitive resin layer 71b and the photosensitive resin layer 73b serve as the first layer 71 and the third layer 73, and the openings formed in these layers serve as the first openings 71h and the third openings 73h.

Figure 19F:
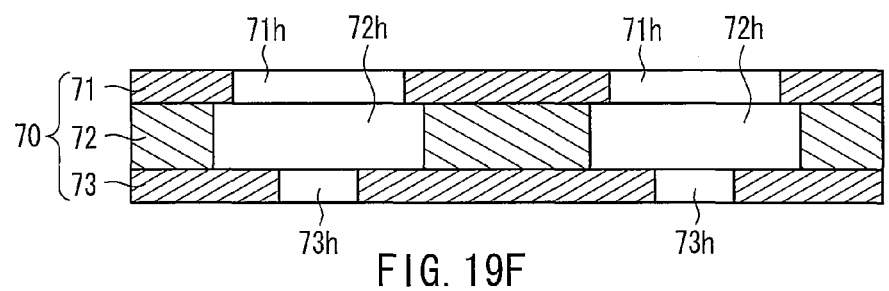

Next, as shown in FIG. 19F, the thick board 72b is wet-etched. As an example, the wet etching can be performed by immersing the thick board 72b in 10:1 buffered hydrofluoric acid (BHF) at room temperature for 60 hours, and thereafter washing it with pure water for 5 minutes. Since the thick board 72b is etched from both sides via the first openings 71h and the third openings 73h, through holes having a larger opening dimension than the first openings 71h and the third openings 73h are formed. The formed through holes serve as the second openings 72h.

As a result, a vapor deposition mask 70 of the present embodiment is obtained.

With the above manufacturing method, the vapor deposition mask 70 can be manufactured easily in a small number of steps, and thus cost reduction can be achieved.

Embodiment 2 is the same as Embodiment 1 except for the above difference. Various modifications mentioned in Embodiment 1 can also be applied to the present embodiment directly or by making an additional change where appropriate.

The embodiments described above are merely intended to illustrate the technological content of the present invention, and the present invention is not construed to be limited to the specific examples. Various modifications are possible within the scope of the appended claims and the spirit of the invention, and the present invention should be interpreted broadly.

INDUSTRIAL APPLICABILITY

There is no particular limitation on the fields to which the present invention is applicable, and the present invention is applicable to various devices that use organic EL elements. Particularly, the present invention is preferably used in organic EL displays.

DESCRIPTION OF SYMBOLS 23R, 23G, 23B Light Emitting Layer
10 Substrate
10e Deposition Surface
50 Vapor Deposition Unit
60 Vapor Deposition Source
61 Vapor Deposition Source Opening
70 Vapor Deposition Mask
71 First Layer
71h First Opening
72 Second Layer
72h Second Opening
73 Third Layer
73h Third Opening
75 Mask Opening
90 Coating Film
91 Vapor Deposition Particle

The invention claimed is:

1. A vapor deposition mask for forming a coating film having a predetermined pattern on a substrate by causing vapor deposition particles to adhere to the substrate,
wherein a plurality of mask openings through which the vapor deposition particles pass are formed in the vapor deposition mask,
a relative position between a vapor deposition source that discharges the vapor deposition particles and the vapor deposition mask is constant, and the mask openings overlap the vapor deposition source directly above the vapor deposition source,
the vapor deposition mask includes a first layer, a second layer and a third layer in this order from a side of the substrate,
a plurality of first openings, a plurality of second openings and a plurality of third openings are formed respectively in the first layer, the second layer and the third layer,
the first openings, the second openings and the third openings are configured to communicate with each other, thereby constituting the mask openings,
an opening dimension of the second openings is larger than an opening dimension of the first openings and is larger than an opening dimension of the third openings,
the opening dimension of the first openings is larger than the opening dimension of the third openings, and
the first layer and the third layer of the vapor deposition mask are made of polyimide.

2. The vapor deposition mask according to claim 1, wherein the second layer is thicker than the first layer and the third layer.

3. The vapor deposition mask according to claim 1, wherein the first layer and the third layer are made of the same material.

4. The vapor deposition mask according to claim 1, having a thickness of 1.2 mm or greater.

5. The vapor deposition mask according to claim 1, wherein the first layer and the third layer both have a thickness of 0.1 mm or less.

6. A manufacturing method for an organic electro luminescence (EL) element including a coating film having a predetermined pattern on a substrate, the method comprising:
a vapor deposition step of forming the coating film by causing vapor deposition particles to adhere to the substrate,
wherein the vapor deposition step is a step in which with the use of a vapor deposition unit including a vapor deposition source having a vapor deposition source opening that discharges the vapor deposition particles and a vapor deposition mask disposed between the vapor deposition source opening and the substrate, in a state in which the substrate and the vapor deposition mask are spaced apart at a fixed interval, the vapor deposition particles that have passed through a plurality of mask openings formed in the vapor deposition mask are caused to adhere to the substrate while one of the substrate and the vapor deposition unit is moved relative to the other,
wherein a plurality of mask openings through which the vapor deposition particles pass are formed in the vapor deposition mask,
a relative position between a vapor deposition source that discharges the vapor deposition particles and the vapor deposition mask is constant, and the mask openings overlap the vapor deposition source directly above the vapor deposition source,
the vapor deposition mask includes a first layer, a second layer and a third layer in this order from a side of the substrate,
a plurality of first openings, a plurality of second openings and a plurality of third openings are formed respectively in the first layer, the second layer and the third layer,
the first openings, the second openings and the third openings are configured to communicate with each other, thereby constituting the mask openings,
an opening dimension of the second openings is larger than an opening dimension of the first openings and is larger than an opening dimension of the third openings,
the opening dimension of the first openings is larger than the opening dimension of the third openings, and
the first layer and the third layer of the vapor deposition mask are made of polyimide.

7. The manufacturing method for an organic EL element according to claim 6,
wherein the coating film is a light emitting layer.

8. A manufacturing device for an organic electro luminescence (EL) element including a coating film having a predetermined pattern on a substrate, the device comprising:
a vapor deposition unit including a vapor deposition source having a vapor deposition source opening configured to discharge vapor deposition particles for forming the coating film and a vapor deposition mask disposed between the vapor deposition source opening and the substrate; and
a moving mechanism configured to move one of the substrate and the vapor deposition unit relative to the other in a state in which the substrate and the vapor deposition mask are spaced apart by a fixed interval,
wherein a plurality of mask openings through which the vapor deposition particles pass are formed in the vapor deposition mask,
a relative position between a vapor deposition source that discharges the vapor deposition particles and the vapor deposition mask is constant, and the mask openings overlap the vapor deposition source directly above the vapor deposition source, the vapor deposition mask includes a first layer, a second layer and a third layer in this order from a side of the substrate, a plurality of first openings, a plurality of second openings and a plurality of third openings are formed respectively in the first layer, the second layer and the third layer, the first openings, the second openings and the third openings are configured to communicate with each other, thereby constituting the mask openings, an opening dimension of the second openings is larger than an opening dimension of the first openings and is larger than an opening dimension of the third openings, the opening dimension of the first openings is larger than the opening dimension of the third openings, and the first layer and the third layer of the vapor deposition mask are made of polyimide.

9. The manufacturing device for an organic EL element according to claim 8, wherein the second layer is thicker than the first layer and the third layer.

10. The manufacturing device for an organic EL element according to claim 8, wherein the vapor deposition mask has a thickness of 1.2 mm or greater.

11. The manufacturing device for an organic EL element according to claim 8, wherein the first layer and the third layer both have a thickness of 0.1 mm or less.

12. The manufacturing device for an organic EL element according to claim 8, wherein the second layer is made of alkali-free glass, and the first openings and the third openings are formed by application of laser light.

* * * * *